US012796429B2

(12) United States Patent
Kao et al.

(10) Patent No.: US 12,796,429 B2
(45) Date of Patent: Nov. 10, 2026

(54) SEMICONDUCTOR DEVICE AND METHOD OF MANUFACTURING THE SAME

(71) Applicant: Taiwan Semiconductor Manufacturing Company, Ltd., Hsinchu (TW)

(72) Inventors: Min-Feng Kao, Chiayi City (TW); Shyh-Fann Ting, Tainan City (TW); Chen-Hsien Lin, Tainan City (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 470 days.

(21) Appl. No.: 18/340,519

(22) Filed: Jun. 23, 2023

(65) Prior Publication Data

US 2024/0429129 A1 Dec. 26, 2024

(51) Int. Cl.

| | |
|---|---|
| ***H10W 20/20*** | (2026.01) |
| ***H10W 20/00*** | (2026.01) |
| ***H10W 20/42*** | (2026.01) |
| ***H10W 20/43*** | (2026.01) |
| ***H10W 70/63*** | (2026.01) |
| ***H10W 90/00*** | (2026.01) |
| *H10W 90/20* | (2026.01) |

(52) U.S. Cl.

CPC ......... *H10W 20/20* (2026.01); *H10W 20/081* (2026.01); *H10W 20/42* (2026.01); *H10W 20/43* (2026.01); *H10W 70/635* (2026.01); *H10W 90/00* (2026.01); *H10W 90/297* (2026.01)

(58) Field of Classification Search

CPC ... H10W 20/20; H10W 20/081; H10W 20/42; H10W 20/43

See application file for complete search history.

(56) References Cited

U.S. PATENT DOCUMENTS

| | | | | |
|---|---|---|---|---|
| 8,692,382 | B2 * | 4/2014 | Yen | B81B 7/007 257/E21.585 |
| 9,543,257 | B2 * | 1/2017 | Tsai | H10D 88/00 |
| 9,691,804 | B2 * | 6/2017 | Huang | H10F 39/014 |
| 9,728,570 | B2 * | 8/2017 | Chiang | H10F 39/014 |

(Continued)

FOREIGN PATENT DOCUMENTS

| | | | | |
|---|---|---|---|---|
| CN | 113257781 A | * 8/2021 | | H10W 20/2134 |
| CN | 113555313 A | * 10/2021 | | H10W 20/0633 |

(Continued)

*Primary Examiner* — Laura M Menz

(74) *Attorney, Agent, or Firm* — Harrity & Harrity, LLP

(57) ABSTRACT

Some implementations herein provide a semiconductor device and methods for forming the semiconductor device. A multi-layer structure of the semiconductor device includes a metal ring structure and a dielectric sidewall structure along interior sidewalls of the metal ring structure. An interconnect structure (e.g., a through silicon via interconnect structure) is along a central interior axis of the metal ring structure. A protective layer is between the interconnect structure and the dielectric sidewall structure. During a deposition operation that fills a cavity with a conductive material to form the interconnect structure, the protective layer may protect the dielectric sidewall structure from damage to improve a quality and/or a reliability of the semiconductor device.

20 Claims, 16 Drawing Sheets

(56) References Cited

U.S. PATENT DOCUMENTS

| | | | | |
|---|---|---|---|---|
| 10,910,272 | B1 * | 2/2021 | Zhou | H10B 41/27 |
| 11,004,733 | B2 * | 5/2021 | Weng | H10P 50/283 |
| 11,094,650 | B1 * | 8/2021 | Liu | H10W 20/023 |
| 11,264,350 | B2 * | 3/2022 | Huang | H10W 72/013 |
| 11,309,241 | B2 * | 4/2022 | Yang | H10W 20/032 |
| 11,552,119 | B2 * | 1/2023 | Kobayashi | H04N 25/70 |
| 11,557,620 | B2 * | 1/2023 | Mun | H10F 39/024 |
| 11,670,604 | B2 * | 6/2023 | Liu | H10W 20/023<br>257/774 |
| 11,908,878 | B2 * | 2/2024 | Kao | H10F 39/024 |
| 11,942,368 | B2 * | 3/2024 | Kao | H10W 20/023 |
| 12,033,919 | B2 * | 7/2024 | Li | H10W 20/023 |
| 12,062,679 | B2 * | 8/2024 | Kao | H10F 39/014 |
| 12,113,034 | B2 * | 10/2024 | Liu | H10W 20/023 |
| 12,237,244 | B2 * | 2/2025 | Chang | H10W 20/023 |
| 2015/0097258 | A1 * | 4/2015 | Shigetoshi | H10B 41/20<br>257/432 |
| 2015/0348874 | A1 * | 12/2015 | Tsai | H10D 64/111<br>257/774 |
| 2015/0348917 | A1 * | 12/2015 | Tsai | H10D 88/00<br>438/618 |
| 2016/0079166 | A1 * | 3/2016 | Farooq | H10W 20/20<br>257/529 |
| 2017/0062343 | A1 * | 3/2017 | Fang | H10W 20/035 |
| 2017/0133414 | A1 * | 5/2017 | Chiang | H10F 39/014 |
| 2021/0249365 | A1 * | 8/2021 | Liu | H10W 20/023 |
| 2021/0296276 | A1 * | 9/2021 | Huang | H10W 72/013 |
| 2021/0375796 | A1 * | 12/2021 | Liu | H10W 20/023 |
| 2022/0223498 | A1 * | 7/2022 | Li | H10W 20/023 |
| 2022/0277998 | A1 * | 9/2022 | Kao | H10W 20/023 |
| 2022/0415757 | A1 * | 12/2022 | Chang | H10W 20/023 |
| 2023/0260933 | A1 * | 8/2023 | Liu | H10W 20/023<br>257/774 |
| 2024/0266219 | A1 * | 8/2024 | Kao | H10W 20/023 |
| 2024/0355710 | A1 * | 10/2024 | Li | H10W 20/023 |
| 2024/0379585 | A1 * | 11/2024 | Liu | H10W 20/023 |
| 2024/0395843 | A1 * | 11/2024 | Kao | H10F 39/024 |
| 2024/0429129 | A1 * | 12/2024 | Kao | H10W 20/023 |
| 2025/0192004 | A1 * | 6/2025 | Chang | H10W 20/023 |
| 2025/0233078 | A1 * | 7/2025 | Yu | H10W 20/01 |
| 2025/0343076 | A1 * | 11/2025 | Kao | H10W 20/023 |

FOREIGN PATENT DOCUMENTS

| | | | | | |
|---|---|---|---|---|---|
| CN | 113257781 | B | * | 12/2024 | H10W 20/2134 |
| CN | 222532096 | U | * | 2/2025 | H10W 90/00 |
| DE | 102021100457 | A1 | * | 7/2022 | H10W 20/2134 |
| DE | 102021119400 | A1 | * | 10/2022 | H10F 39/014 |
| DE | 102021100457 | B4 | * | 10/2023 | H10W 20/2134 |
| EP | 3709358 | B1 | * | 2/2024 | H10W 10/00 |
| KR | 20150137968 | A | * | 12/2015 | H10W 20/0238 |
| KR | 102111474 | B1 | * | 6/2020 | H10W 20/0245 |
| KR | 102545170 | B1 | * | 6/2023 | H01L 27/14627 |
| KR | 20230145955 | A | * | 10/2023 | H10W 20/2134 |
| TW | 202131471 | A | * | 8/2021 | H10W 20/2134 |
| TW | 202201520 | A | | 1/2022 | |
| TW | I758122 | B | * | 3/2022 | H10W 20/2134 |
| TW | I770703 | B | * | 7/2022 | H10W 20/2134 |
| TW | 202230765 | A | | 8/2022 | |
| TW | 202501740 | A | * | 1/2025 | H10W 90/00 |
| TW | I888890 | B | * | 7/2025 | H10W 90/00 |
| WO | WO-2021080641 | A1 | * | 4/2021 | H10W 10/181 |

* cited by examiner

SEMICONDUCTOR DEVICE AND METHOD OF MANUFACTURING THE SAME

BACKGROUND

A multi-die package may include one or more integrated circuit (IC) dies that are bonded to an interposer. Examples of IC dies include a system-on-chip (SoC) IC die, a dynamic random access memory (DRAM) IC die, a logic IC die, and/or a high bandwidth memory (HBM) IC die, among other examples. An interposer may be used to redistribute ball contact areas from the IC dies to a larger area of the interposer. An interposer may enable three-dimensional (3D) packaging and/or other advanced semiconductor packaging techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
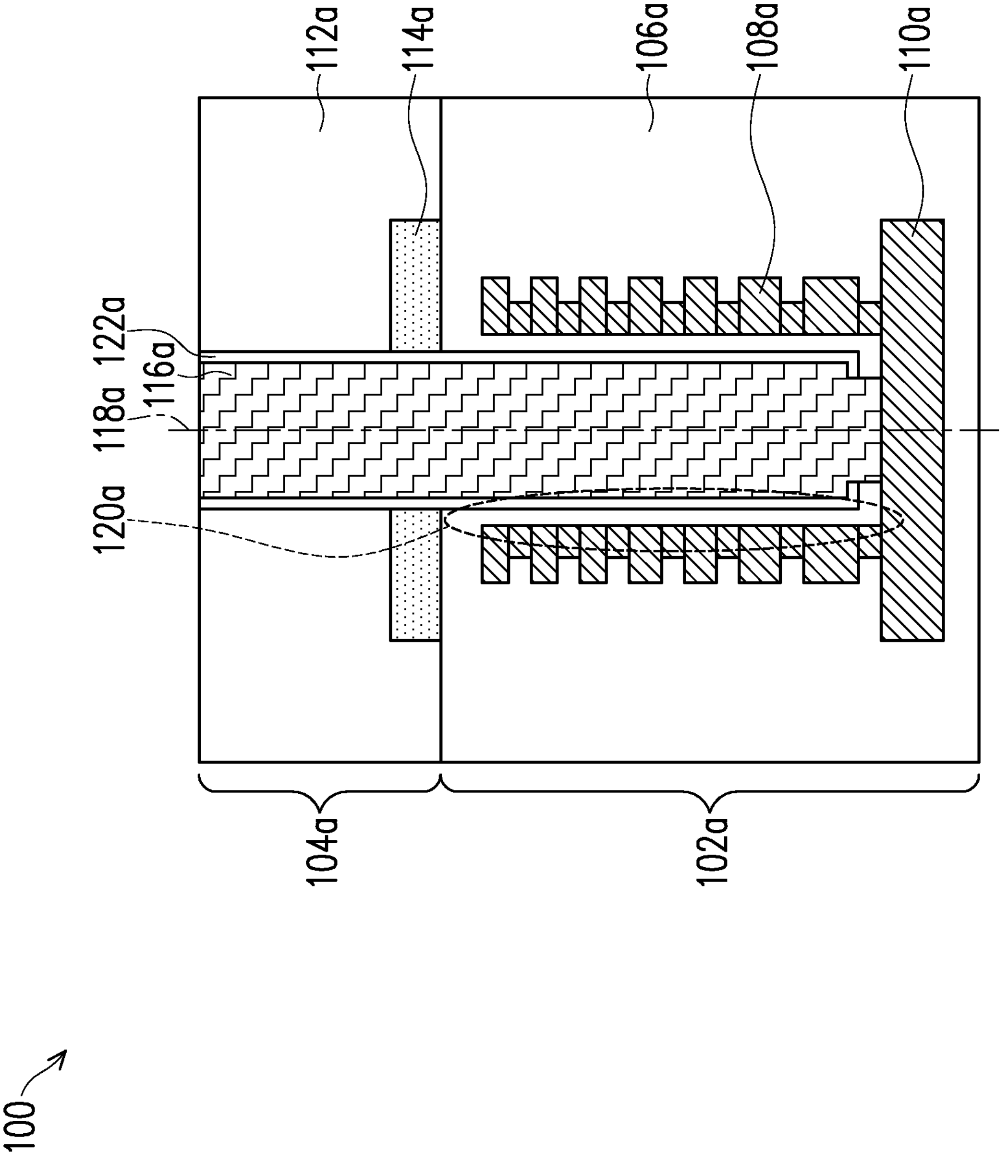
FIG. 1 is a diagram of an example semiconductor structure described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor device (e.g., a semiconductor die or a semiconductor package) may include an interconnect structure such as a through silicon via structure that passes through a multi-layer interconnect structure (a multi-layer interconnect structure included within an integrated circuit device, a substrate, or an interposer, among other examples). Furthermore, the multi-layer structure may include a metal ring structure (e.g., a protective enclosure) that interposes the through silicon via structure and surrounding materials of the multi-layer interconnect structure (e.g., multiple layers of surrounding dielectric and/or conductive materials). The metal ring structure may reduce a likelihood of damage to the surrounding materials during formation of the through silicon via structure. Further, the metal ring structure may inhibit diffusion and/or migration of materials from the through silicon via structure into the surrounding materials to reduce a likelihood of contamination within the surrounding materials and/or a likelihood of electrical shorting between layers of the surrounding materials.

Formation of the through silicon via structure may include etching a cavity through and/or into one or more dielectric layers within an internal perimeter of the metal ring structure. After the etching of the cavity, a dielectric sidewall structure may remain on interior surfaces of the metal ring structure. During a deposition operation that fills the cavity with a conductive material to form the through silicon via structure, the dielectric sidewall structure may be prone to delamination defects due to damage incurred during the etching of the cavity. Such damage and/or delamination defects may reduce a quality (e.g., a manufacturing yield) and/or a reliability (e.g., during field use) of the semiconductor package.

Some implementations herein provide a semiconductor device and methods for forming the semiconductor device. A multi-layer structure of the semiconductor device includes a metal ring structure and a dielectric sidewall structure along interior sidewalls of the metal ring structure. An interconnect structure (e.g., a through silicon via structure) is along a central interior axis of the metal ring structure. A protective layer is between the interconnect structure and the dielectric sidewall structure.

During a deposition operation that fills a cavity along the central interior axis with a conductive material to form the interconnect structure, the protective layer may protect the dielectric sidewall structure from damage (e.g., delamination effects and/or pitting). Furthermore, the protective layer may inhibit diffusion of the conductive material into the dielectric sidewall structure and/or the metal ring structure.

In this way, a quality and/or a reliability of the semiconductor device including the interconnect structure and formed using the protective layer is improved relative to another semiconductor device including the interconnect structure but not formed using the protective layer. By improving the quality and/or reliability of the semiconductor device, an amount of resources to manufacture and support a volume of the semiconductor device including the interconnect structure (e.g., raw materials, labor, semiconductor manufacturing tools, and/or computing resources) is reduced.

FIG. 1 is a diagram of an example semiconductor structure 100 described herein. The example semiconductor structure 100 includes a multi-layer structure 102*a* and a semiconductor layer structure 104*a*. In relation to the multi-layer structure 102*a*, and as shown in FIG. 1, the semiconductor layer structure 104*a* is above the multi-layer structure 102*a*.

The multi-layer structure 102*a* includes one or more dielectric layers 106*a*. The one or more dielectric layers 106*a* may include a dielectric material such as a silicon oxide material, a silicon nitride material, a low-k dielectric material, or another suitable dielectric material, among other examples. Furthermore, one or more metal layers may be interspersed within the one or more dielectric layers 106*a* to form a metal ring structure 108*a*. The one or more metal layers may include a titanium nitride material, a titanium material, a copper material, a gold material, a nickel material, an aluminum material, or another suitable metal material, among other examples. Additionally, or alternatively, the one or more metal layers that form the metal ring structure 108*a* may include one or more layers of conductive material other than a metal material. Furthermore, and in some implementations and as shown in FIG. 1, a metal layer 110*a* connects with a bottom perimeter of the metal ring structure 108*a* and is included as part of the metal ring structure 108*a*. As part of a semiconductor device (a semiconductor die or a semiconductor package, among other examples), the metal ring structure 108*a* and/or the metal layer 110*a* may provide electrical routing and/or electrical connectively amongst circuitry and interconnect structures (e.g., internal interconnect structures and/or external interconnect structures) among other examples.

The semiconductor layer structure 104*a* may further include a semiconductor layer 112*a* that includes a material such as silicon, among other examples. In some implementations, the semiconductor layer structure 104*a* includes semiconductor devices and/or features formed in the semiconductor layer 112*a*. For example, and as shown in FIG. 1, the semiconductor layer structure 104*a* includes a shallow trench isolation region 114*a* (e.g., a non-conductive region to electrically isolate adjacent devices within the semiconductor layer 112*a*).

As shown in FIG. 1, an interconnect structure 116*a* is disposed along an approximately central axis 118*a* of the metal ring structure 108. The interconnect structure 116*a*, which corresponds to a backside through silicon via (BTSV) structure, may include a conductive material such as a titanium nitride material, a titanium material, a copper material, a gold material, a nickel material, an aluminum material, or another suitable conductive material, among other examples. In a semiconductor package (a ball grid array semiconductor package, a wafer-on-wafer semiconductor package, an image sensor semiconductor package, a stacked die semiconductor package, or a three-dimensional integrated circuit die package, among other examples), the interconnect structure 116*a* may provide electrical connectivity between the metal layer 110*a* and another conductive structure such as an integrated circuit die pad, a wire bond, a pillar, or a solder ball, among other examples.

The multi-layer structure 102*a* of FIG. 1 further includes a dielectric sidewall structure 120*a* along interior surfaces of the metal ring structure 108*a*. In some implementations, and as described in connection with FIGS. 2A-2D and elsewhere herein, the dielectric sidewall structure 120*a* includes portions of the one or more dielectric layers 106*a* remaining after an etching operation to form a cavity that is used during formation of the interconnect structure 116*a*.

As further shown in FIG. 1, a protective layer 122*a* (e.g., a protective sidewall layer) is between the interconnect structure 116*a* and the dielectric sidewall structure 120*a*. The protective layer 122*a* may include a silicon dioxide material, an aluminum oxide material, or another suitable oxide material, among other examples.

In FIG. 1, the metal layer 110*a* and the protective layer 122*a* are separated. Further, and as shown in FIG. 1, the metal layer 110*a* and the interconnect structure 116*a* are connected.

As described in greater detail in connection with FIGS. 2A-2D and elsewhere herein, the protective layer 122*a* may protect the dielectric sidewall structure 120*a* from damage (e.g., delamination effects and/or pitting) during a deposition operation that forms the interconnect structure 116*a*. Furthermore, the protective layer 122*a* may inhibit diffusion of a material used to from the interconnect structure 116*a* into the dielectric sidewall structure 120*a*, the metal ring structure 108*a*, and/or the one or more dielectric layers 106*a*.

In this way, a quality and/or a reliability of a semiconductor device including the interconnect structure 116*a*, and formed using the protective layer 122*a*, is improved relative to another similar semiconductor device formed without using a protective layer. By improving the quality and/or reliability of the semiconductor device, an amount of resources to manufacture and support a volume of the semiconductor device (e.g., raw materials, labor, semiconductor manufacturing tools, and/or computing resources) is reduced.

The number and arrangement of devices shown in FIG. 1 are provided as one or more examples. In practice, there may be additional devices, fewer devices, different devices, or differently arranged devices than those shown in FIG. 1.

FIGS. 2A-2D are diagrams of an example implementation 200 described herein. The implementation 200 includes a series of semiconductor manufacturing operations that form the semiconductor structure 100 of FIG. 1. The series of semiconductor manufacturing operations may be performed by one or more semiconductor processing tool sets, such as a deposition tool set (e.g., a vapor deposition tool and/or an electroplating tool), a photolithography tool set (a photoresist coat tool, an exposure tool, a developer tool, and or a photoresist removal tool), an etch tool set (e.g., a dry etch tool set or a wet etch tool), a planarization tool set (e.g., a chemical mechanical planarization (CMP) tool), and/or a bonding tool set (e.g., a eutectic bonding tool set) among other examples.

Figure 2A:
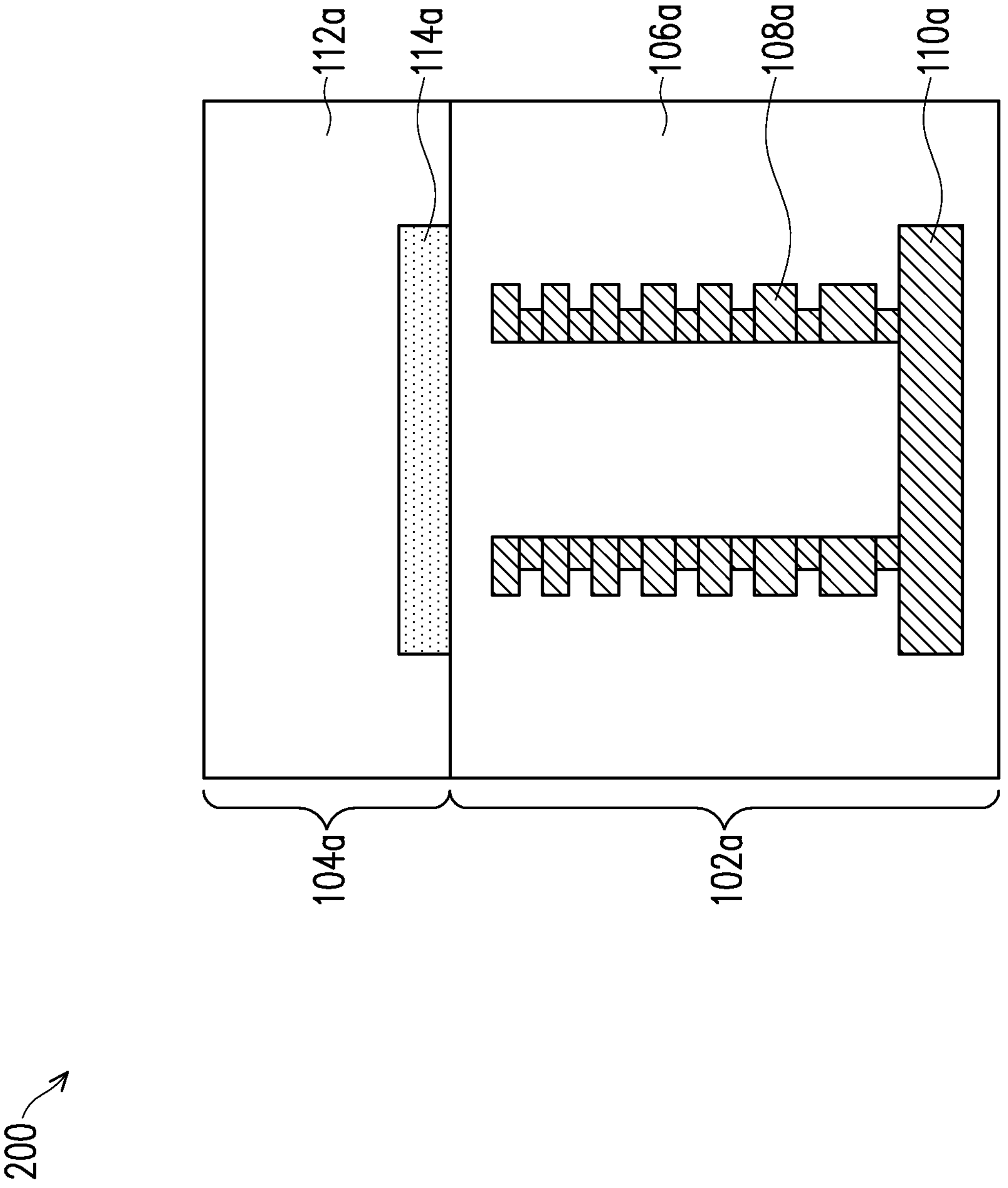
FIGS. 2A-2D are diagrams of an example implementation described herein.

FIG. 2A shows the semiconductor layer structure 104*a* on and/or over the multi-layer structure 102*a*. In some implementations, layers of the multi-layer structure 102*a* (e.g., the one or more dielectric layers 106*a*, metal layers of the metal ring structure 108*a*, and/or the metal layer 110*a*) are deposited, sequentially by the deposition tool set in a chemical vapor deposition (CVD) operation, a physical vapor deposition (PVD) operation, an atomic layer deposition (ALD) operation, an electroplating operation, and/or another suitable deposition operation.

In some implementations, the planarization tool set planarizes a layer of the multi-layer structure 102*a* after the deposition tool sets deposits the layer. In some implementations, the photolithography tool set and/or the etch tool set may perform a series of patterning and/or etching operations to form a feature from the layer after deposition and/or planarization.

In some implementations, and as part of forming the semiconductor layer structure 104*a*, the deposition tool set may form the semiconductor layer 112*a* on the multi-layer structure 102*a* using an epitaxial growth operation or another suitable deposition operation. Alternatively, the bonding tool set may join the semiconductor layer structure

104*a* (e.g., the semiconductor layer structure 104*a* including the shallow trench isolation region 114*a*) and the multi-layer structure 102*a* using a eutectic bonding operation or another suitable bonding operation.

Figure 2B:
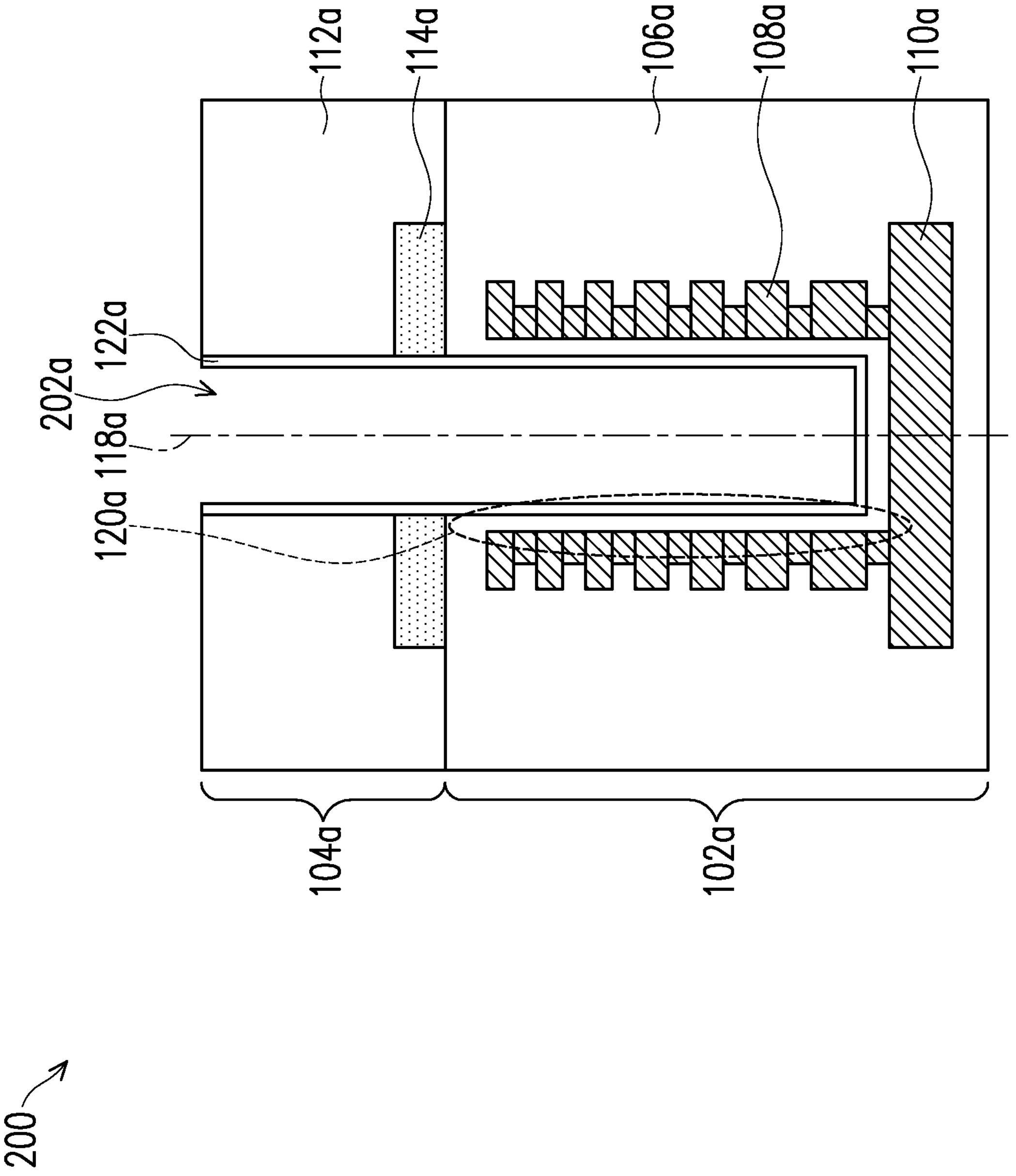

As shown in FIG. 2B, and as part of implementation 200, a cavity 202*a* is formed through the semiconductor layer structure 104*a* and into the one or more dielectric layers 106*a*. The cavity 202*a* is formed within the metal ring structure 108*a* and along the approximately central axis 118*a*. In some implementations, a pattern in a photoresist layer is used to etch the semiconductor layer structure 104*a* and a portion of the one or more dielectric layers 106*a* to form the cavity 202*a*. In these implementations, the photoresist coat tool forms the photoresist layer on the semiconductor layer structure 104*a*. The exposure tool exposes the photoresist layer to a radiation source to pattern the photoresist layer. The developer tool develops and removes portions of the photoresist layer to expose the pattern. The etch tool etches the semiconductor layer structure 104*a* (e.g., portions of the semiconductor layer 112*a* and/or the shallow trench isolation region 114*a*) and the multi-layer structure 102*a* (e.g., a portion of the one or more dielectric layers 106*a*) based on the pattern to form the cavity 202*a*. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching through the semiconductor layer structure 104*a* and into the one or more dielectric layers 106*a* based on a pattern.

After formation of the cavity 202*a*, the deposition tool may deposit the protective layer 122*a* in a PVD operation, an ALD operation, a CVD operation, an epitaxy operation, an oxidation operation, another type of deposition operation. The deposition too may deposit the protective layer 122*a* within the cavity 202*a*, including on and/or over the dielectric sidewall structure 120*a* (e.g., portions of the one or more dielectric layers 106*a* exposed by, and/or remaining from, the etch operation that forms the cavity 202*a*).

Figure 2C:
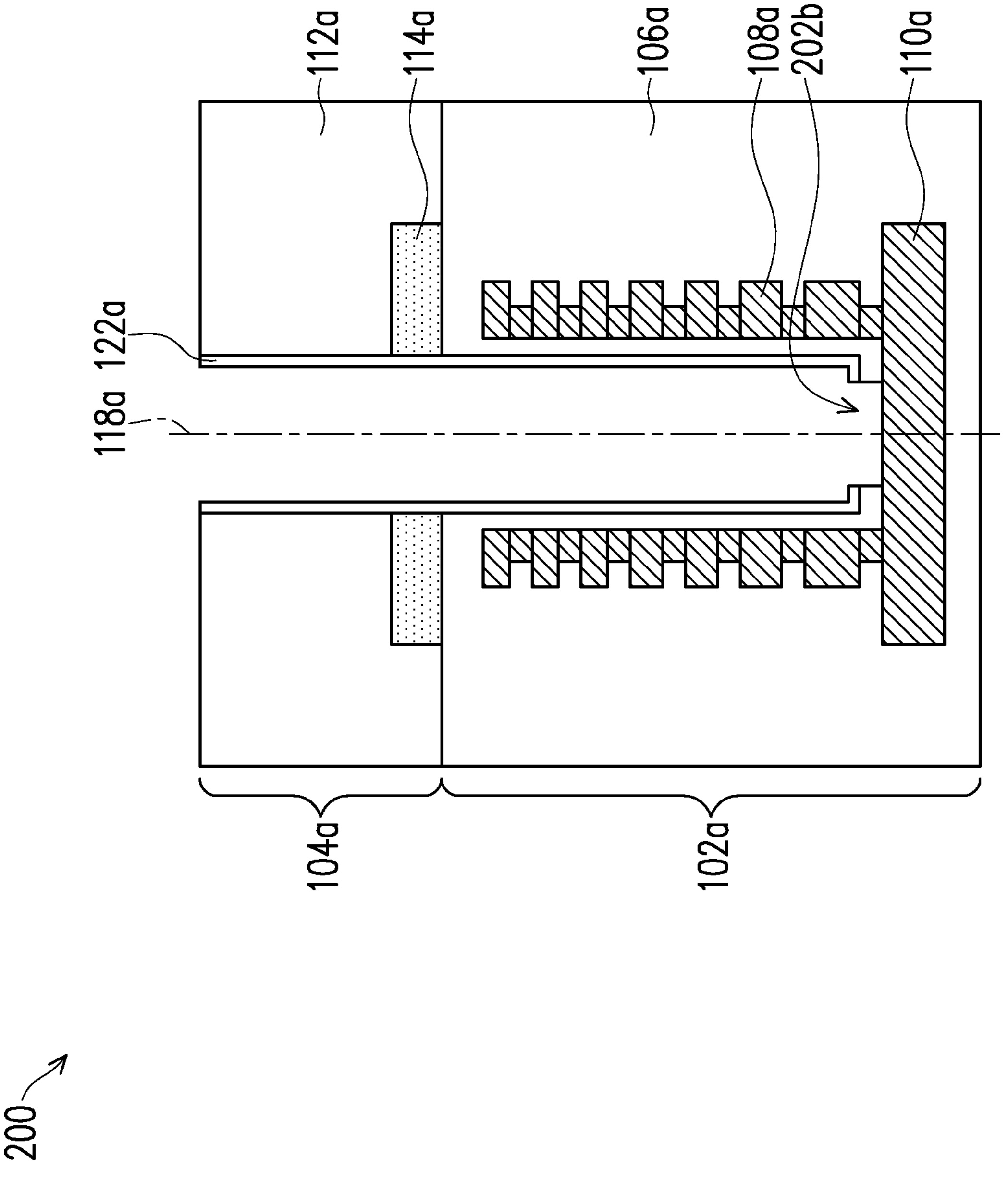

As shown in FIG. 2C, and as part of implementation 200, a cavity 202*b* is formed through the protective layer 122*a* and through a portion of the one or more dielectric layers 106*a* to expose the metal layer 110*a*. The cavity 202*b* is along the approximately central axis 118*a*. In some implementations, a pattern in a photoresist layer is used to etch through the protective layer 122*a* and through a portion of the one or more dielectric layers 106*a* to form the cavity 202*b*. In these implementations, the photoresist coat tool forms the photoresist layer on the semiconductor layer structure 104*a* and within the cavity 202*a*. The exposure tool exposes the photoresist layer to a radiation source to pattern the photoresist layer. The developer tool develops and removes portions of the photoresist layer to expose the pattern. The etch tool etches through the protective layer 122*a* and through a portion of the one or more dielectric layers 106*a* based on the pattern to form the cavity 202*b*. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching through the protective layer 122*a* and through a portion of the one or more dielectric layers 106*a* based on a pattern.

Figure 2D:
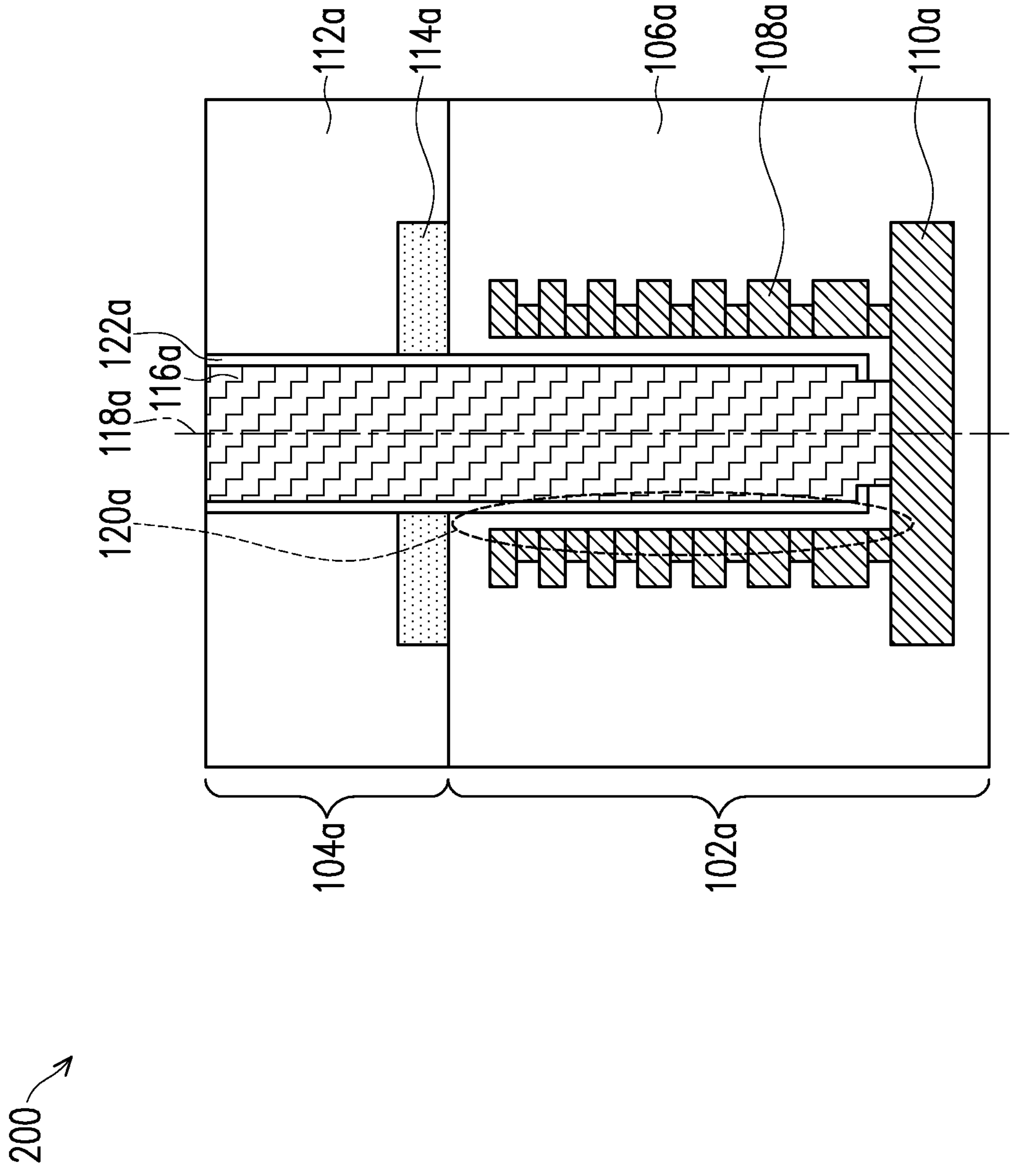

As shown in FIG. 2D, and as part of implementation 200, the interconnect structure 116*a* is formed along the approximately central axis 118*a* (e.g., within the cavities 202*a* and 202*b*). The deposition tool and/or the plating tool may deposit the interconnect structure 116*a* in a CVD operation, a PVD operation, an ALD operation, an electroplating operation, and/or another suitable deposition operation. some implementations, the planarization tool planarizes the interconnect structure 116*a* after the deposition tool and/or the plating tool deposits the interconnect structure 116*a*.

During the deposition operation of FIG. 2D, the protective layer 122*a* may protect the dielectric sidewall structure 120*a* from damage (e.g., delamination effects and/or pitting). Furthermore, the protective layer 122*a* may inhibit diffusion of a material used to form the interconnect structure 116*a* into the dielectric sidewall structure 120*a*, the metal ring structure 108*a*, and/or the one or more dielectric layers 106*a*. In this way, a quality and/or a reliability of a semiconductor device including the multi-layer structure 102*a* and formed using the protective layer 122*a* is improved relative to another semiconductor device including a similar multi-layer structure but not formed using the protective layer 122*a*.

Although FIGS. 2A-2D show an example series of manufacturing operations, in some implementations, the series of manufacturing operations may include additional manufacturing operations, fewer manufacturing operations, different manufacturing operations, or differently arranged manufacturing operations than those depicted in FIGS. 2A-2D. Additionally, or alternatively, one or more of the manufacturing operations may be performed by other semiconductor processing tools than those described in connection with FIGS. 2A-2D.

Figure 3:
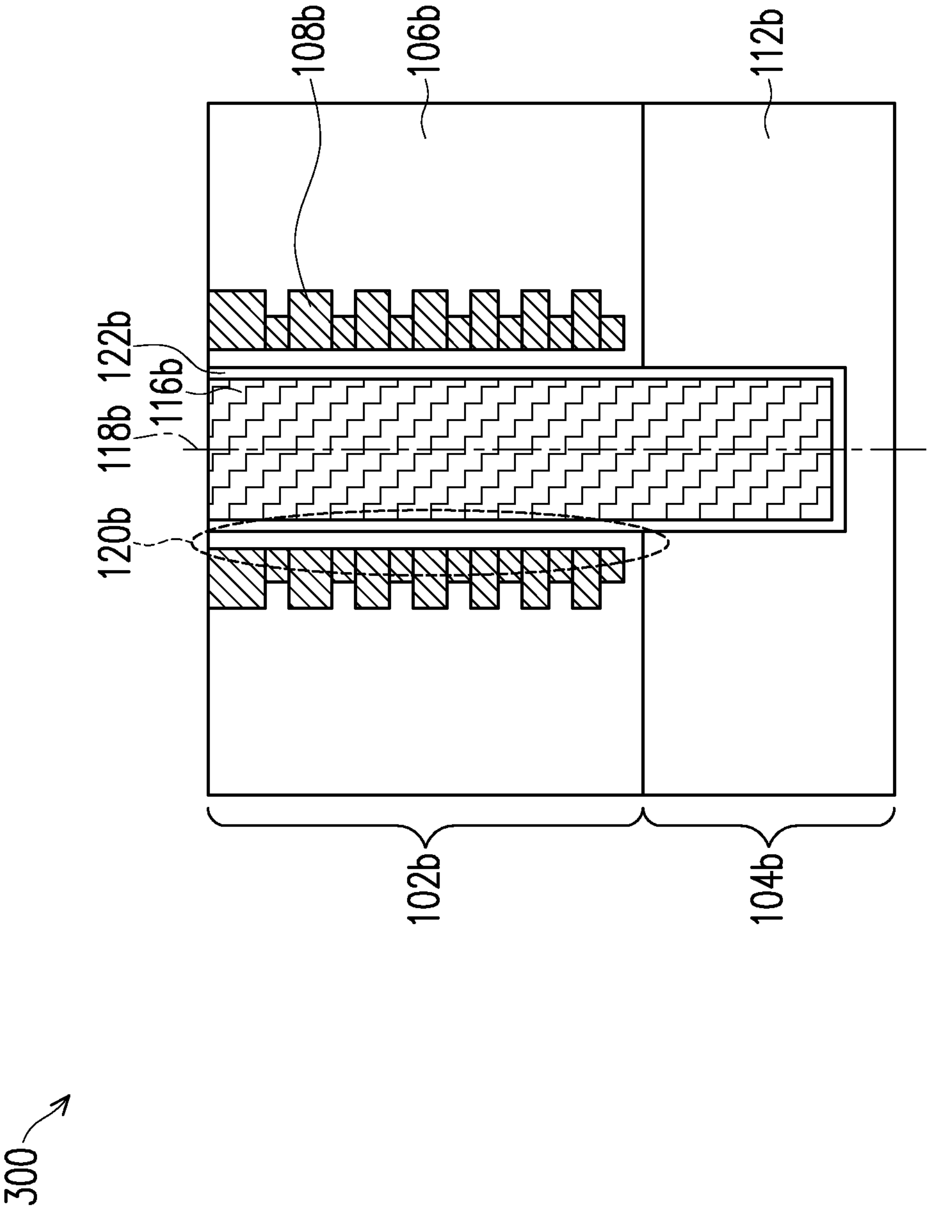
FIG. 3 is a diagram of an example semiconductor structure described herein.

FIG. 3 is a diagram of an example semiconductor structure 300 described herein. The example semiconductor structure 300 includes a multi-layer structure 102*b* and a semiconductor layer structure 104*b*. In relation to the multi-layer structure 102*b*, and as shown in FIG. 3, the semiconductor layer structure 104*b* is below the multi-layer structure 102*b*.

The multi-layer structure 102*b* includes one or more dielectric layers 106*b*. The one or more dielectric layers 106*b* may include a dielectric material such as a silicon oxide material, a silicon nitride material, a low-k dielectric material, or another suitable dielectric material, among other examples. Furthermore, one or more metal layers may be interspersed within the one or more dielectric layers 106*b* to form a metal ring structure 108*b*. The one or more metal layers may include a titanium nitride material, a titanium material, a copper material, a gold material, a nickel material, an aluminum material, or another suitable metal material, among other examples. Additionally, or alternatively, the one or more metal layers that form the metal ring structure 108*b* may include one or more layers of conductive material other than a metal material.

As part of a semiconductor device (a semiconductor die or a semiconductor package, among other examples), the metal ring structure 108*b* may provide electrical routing and/or electrical connectively amongst circuitry, internal interconnect structures, and/or external interconnect structures, among other examples. Additionally, or alternatively and within the semiconductor device, the semiconductor layer structure 104*b* may include a semiconductor layer 112*b* that includes a material such as silicon, among other examples.

As shown in FIG. 3, an interconnect structure 116*b* is disposed along an approximately central axis 118*b* of the metal ring structure 108*b*. Further, and as shown in FIG. 3, at least a portion of the interconnect structure 116*b* penetrates into the semiconductor layer structure 104*b* below the multi-layer structure 102*b*. The interconnect structure 116*b*, which corresponds to a frontside through silicon via (FTSV) structure, may include a conductive material such as a titanium nitride material, a titanium material, a copper material, a gold material, a nickel material, an aluminum material, or another suitable conductive material, among other examples. In a semiconductor package (a ball grid array semiconductor package, a wafer-on-wafer semiconductor package, an image sensor semiconductor package, a stacked die semiconductor package, or a three-dimensional integrated circuit die package, among other examples) the interconnect structure 116*b* may connect with another conductive structure such as an integrated circuit die pad, a wire bond, a pillar, or a solder ball, among other examples.

The multi-layer structure 102*b* of FIG. 3 further includes a dielectric sidewall structure 120*b* along interior surfaces of the metal ring structure 108*b*. In some implementations, and as described in connection with FIGS. 4A-4C and elsewhere herein, the dielectric sidewall structure 120*b* includes portions of the one or more dielectric layers 106*b* remaining after an etching operation to form a cavity that is used during formation of the interconnect structure 116*b*.

As further shown in FIG. 3, a protective layer 122*b* (e.g., a protective sidewall layer) is between the interconnect structure 116*b* and the dielectric sidewall structure 120*b*. The protective layer 122*b* may include a silicon dioxide material, an aluminum oxide material, or another suitable oxide material, among other examples.

As described in greater detail in connection with FIGS. 4A-4C and elsewhere herein, the protective layer 122*b* may protect the dielectric sidewall structure 120*b* from damage (e.g., delamination effects and/or pitting) during a deposition operation that forms the interconnect structure 116*b*. Furthermore, the protective layer 122*b* may inhibit diffusion of a material used to from the interconnect structure 116*b* into the dielectric sidewall structure 120*b*, the metal ring structure 108*b*, and/or the one or more dielectric layers 106*b*.

In this way, a quality and/or a reliability of a semiconductor device including the interconnect structure 116*b*, and formed using the protective layer 122*b*, is improved relative to another similar semiconductor device formed without using a protective layer. By improving the quality and/or reliability of the semiconductor device, an amount of resources to manufacture and support a volume of the semiconductor device (e.g., raw materials, labor, semiconductor manufacturing tools, and/or computing resources) is reduced.

The number and arrangement of devices shown in FIG. 3 are provided as one or more examples. In practice, there may be additional devices, fewer devices, different devices, or differently arranged devices than those shown in FIG. 3.

Figure 4A:
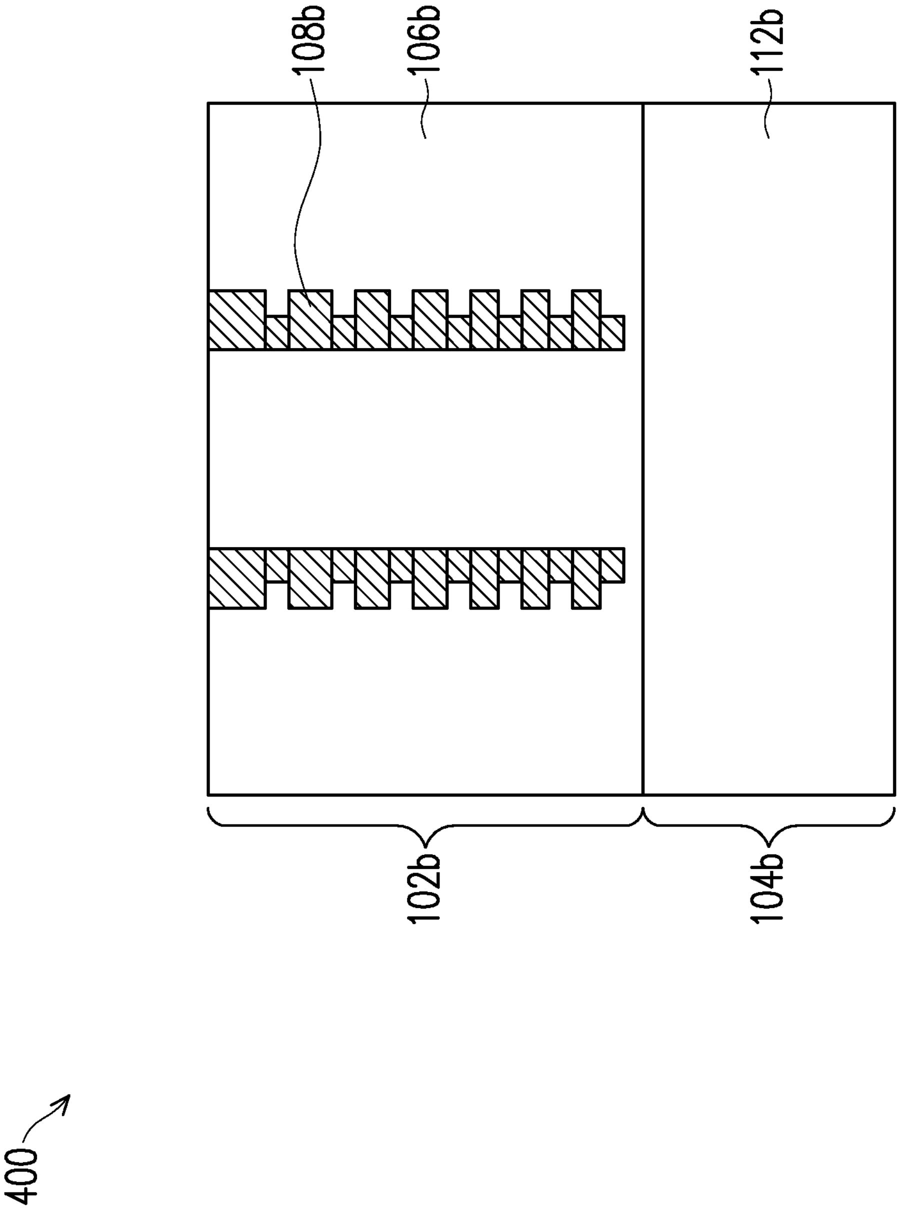
FIGS. 4A-4C are diagrams of an example implementation described herein.
Figure 4B:
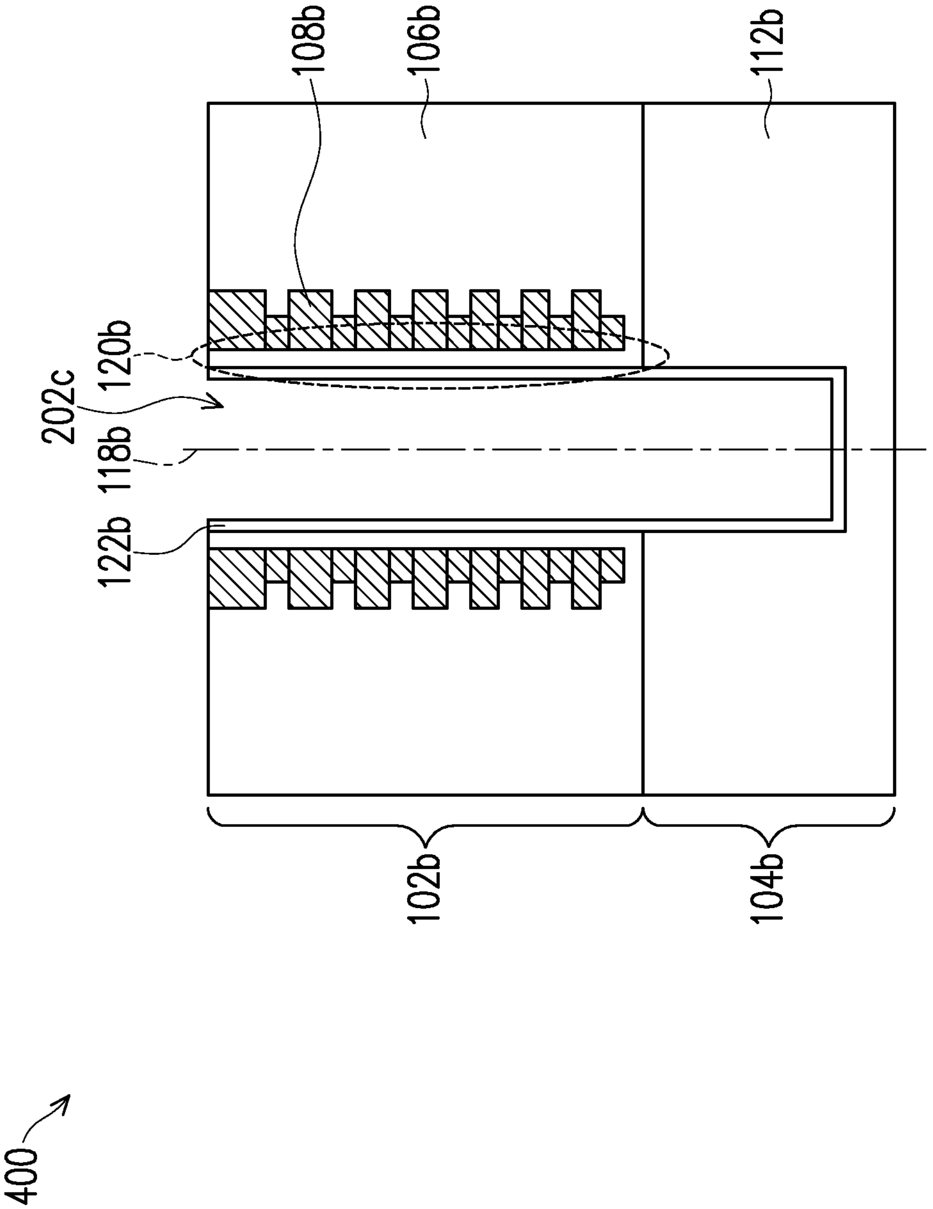
Figure 4C:
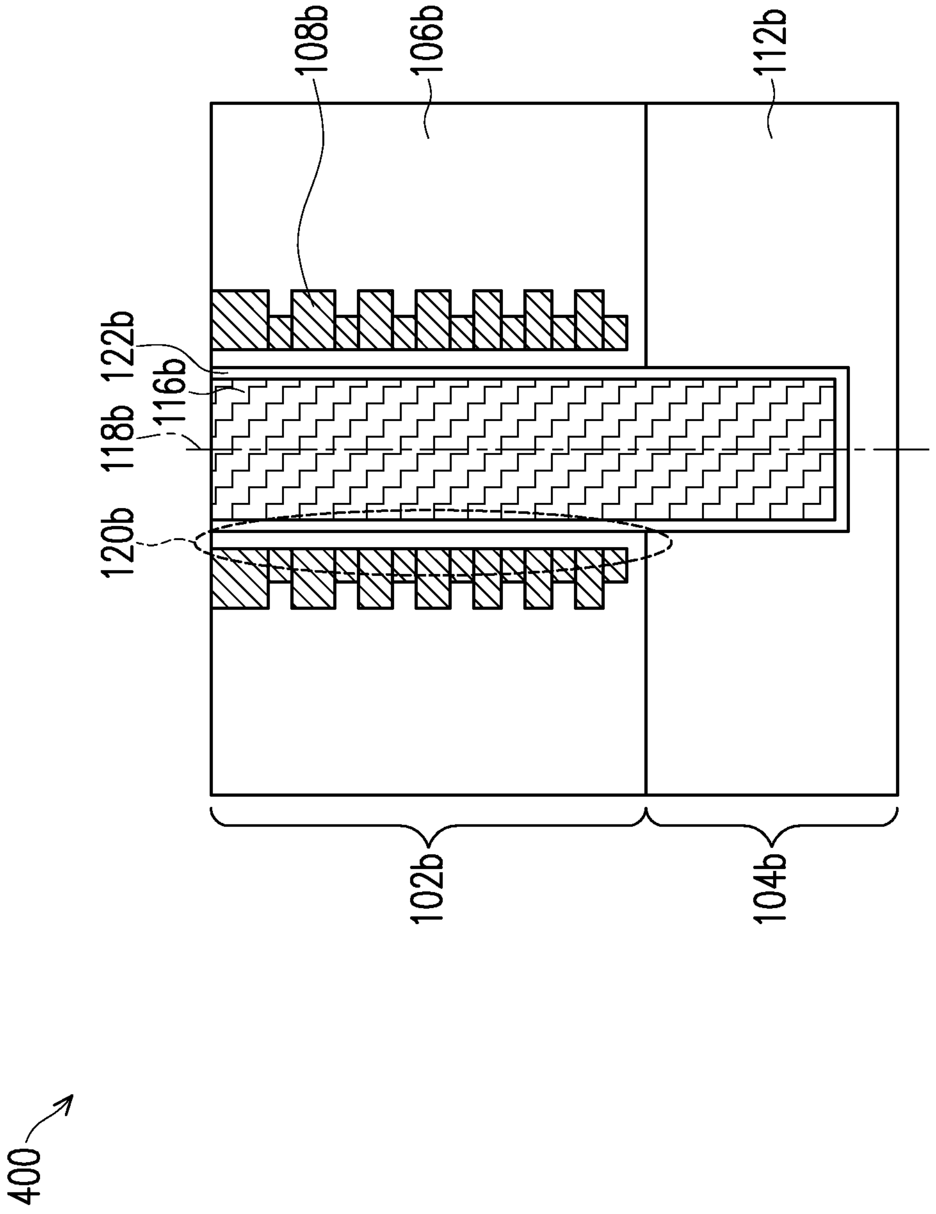

FIGS. 4A-4C are diagrams of an example implementation 400 described herein. The implementation 400 includes a series of semiconductor manufacturing operations that form the semiconductor structure 300 of FIG. 3. The series of semiconductor manufacturing operations may be performed by one or more semiconductor processing tool sets, such as a deposition tool set (e.g., a vapor deposition tool and/or an electroplating tool), a photolithography tool set (a photoresist coat tool, an exposure tool, a developer tool, and or a photoresist removal tool), an etch tool set (e.g., a dry etch tool set or a wet etch tool), a planarization tool set (e.g., a chemical mechanical planarization (CMP) tool), and/or a bonding tool set (e.g., a eutectic bonding tool set) among other examples.

FIG. 4A shows the semiconductor layer structure 104*b* on and/or below the multi-layer structure 102*b*. In some implementations, layers of the multi-layer structure 102*b* (e.g., the one or more dielectric layers 106*b* and metal layers of the metal ring structure 108*b* are deposited, sequentially by the deposition tool set in a chemical vapor deposition (CVD) operation, a physical vapor deposition (PVD) operation, an atomic layer deposition (ALD) operation, an electroplating operation, and/or another suitable deposition operation. In some implementations, the planarization tool set planarizes a layer of the multi-layer structure 102*a* after the deposition tool sets deposits the layer.

In some implementations, and as part of forming the semiconductor layer structure 104*b*, the deposition tool set may form the semiconductor layer 112*b* on the multi-layer structure 102*b* using an epitaxial growth operation or another suitable deposition operation. Alternatively, the bonding tool set may join the semiconductor layer structure 104*b* and the multi-layer structure 102*b* using a eutectic bonding operation or another suitable bonding operation.

As shown in FIG. 4B, and as part of implementation 400, a cavity 202*c* is formed through the one or more dielectric layers 106*b* and into the semiconductor layer 112*b*. The cavity 202*c* is formed within the metal ring structure 108*b* and along the approximately central axis 118*b*. In some implementations, a pattern in a photoresist layer is used to etch the multi-layer structure 102*b* (e.g., the one or more dielectric layers 106*b*) and a portion of the semiconductor layer structure 104*b* (e.g., a portion of the semiconductor layer 112*b*) to form the cavity 202*c*. In these implementations, the photoresist coat tool forms the photoresist layer on the multi-layer structure 102*b*. The exposure tool exposes the photoresist layer to a radiation source to pattern the photoresist layer. The developer tool develops and removes portions of the photoresist layer to expose the pattern. The etch tool etches portions of the one or more dielectric layers 106*b* and a portion of the semiconductor layer 112*b* based on the pattern to form the cavity 202*c*. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching through the semiconductor layer structure 104*a* and into the one or more dielectric layers 106*a* based on a pattern.

After formation of the cavity 202*c*, the deposition tool may deposit the protective layer 122*b* in a PVD operation, an ALD operation, a CVD operation, an epitaxy operation, an oxidation operation, another type of deposition operation. The deposition tool may deposit the protective layer 122*b* within the cavity 202*c*, including on and/or over the dielectric sidewall structure 120*b* (e.g., portions of the one or more dielectric layers 106*b* exposed by, and/or remaining from, the etch operation that forms the cavity 202*c*).

As shown in FIG. 4C, and as part of implementation 400, the interconnect structure 116*b* is formed along the approximately central axis 118*b* (e.g., within the cavity 202*c*). The deposition tool and/or the plating tool may deposit the interconnect structure 116*b* in a CVD operation, a PVD operation, an ALD operation, an electroplating operation, and/or another suitable deposition operation. some implementations, the planarization tool planarizes the interconnect structure 116*b* after the deposition tool and/or the plating tool deposits the interconnect structure 116*b*.

During the deposition operation of FIG. 4C, the protective layer 122*b* may protect the dielectric sidewall structure 120*b* from damage (e.g., delamination effects and/or pitting). Furthermore, the protective layer 122*b* may inhibit diffusion of a material used to from the interconnect structure 116*b* into the dielectric sidewall structure 120*b*, the metal ring structure 108*b*, and/or the one or more dielectric layers 106*b*. In this way, a quality and/or a reliability of a semiconductor device including the multi-layer structure 102*b* and formed using the protective layer 122*b* is improved relative to another semiconductor device including a similar multi-layer structure but not formed using the protective layer 122*b*.

Although FIGS. 4A-4C show an example series of manufacturing operations, in some implementations, the series of manufacturing operations may include additional manufacturing operations, fewer manufacturing operations, different manufacturing operations, or differently arranged manufacturing operations than those depicted in FIGS. 4A-4C. Additionally, or alternatively, one or more of the manufacturing operations may be performed by other semiconductor processing tools than those described in connection with FIGS. 4A-4C.

As described in connection with FIGS. 1-4C, a device (e.g., a semiconductor die and/or a semiconductor package) includes a multi-layer structure (e.g., the multi-layer structure 102*a* and/or 102*b*) including a metal ring structure (e.g., the metal ring structure 108*a* and/or 108*b*) and a dielectric sidewall structure (e.g., the dielectric sidewall structure 120*a* and/or 120*b*) along interior surfaces of the metal ring structure. The device includes an interconnect structure (e.g., the interconnect structure 116*a* and/or 116*b*) that is disposed along an approximately central axis (e.g., the central axis 118*a* and/or 118*b*) of the metal ring structure. The device includes a protective layer (e.g., the protective layer 122*a* and/or 122*b*) between the interconnect structure and the dielectric sidewall structure.

Figure 5:
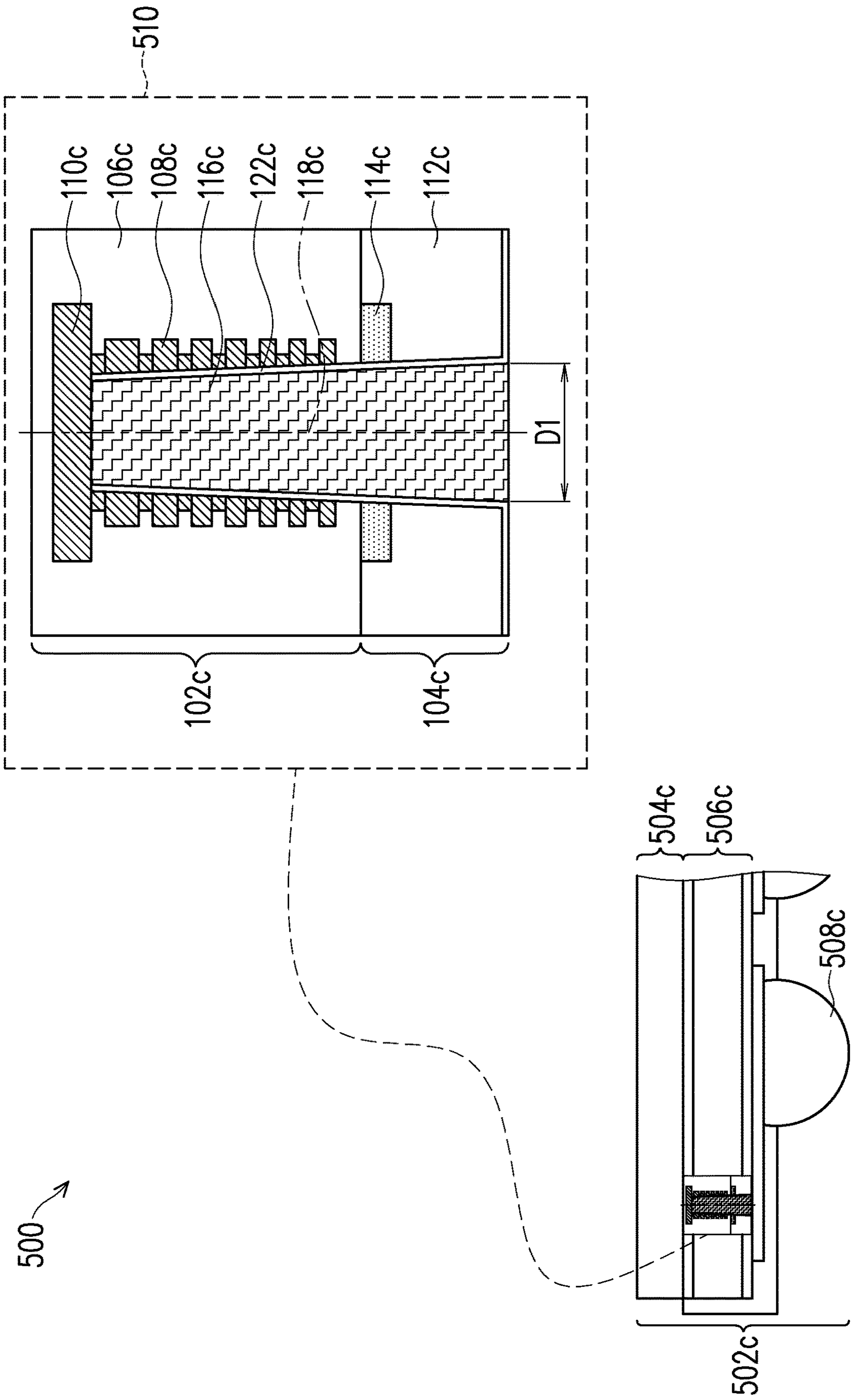
FIGS. 5 and 6 are diagrams of example implementations of a semiconductor package described herein.

FIG. 5 is a diagram of an example implementation 500 of an example semiconductor package 502*c*. The semiconductor package 502*c*, in whole or in part, may include features related to a ball grid array semiconductor package, a wafer-on-wafer semiconductor package, an image sensor semiconductor package, a stacked die semiconductor package, or a three-dimensional integrated circuit die package, among other examples.

As shown in FIG. 5, the semiconductor package 502*c* includes one or more integrated circuit dies 504*c*. The one or more integrated circuit dies 504*c* may correspond to one or more of a memory integrated circuit die, a logic integrated circuit die, or a computer image sensor integrated circuit die, among other examples. In some implementations, the one or more integrated circuit dies 504*c* are "stacked" integrated circuit dies (e.g., a three-dimensional structure including integrated circuit dies stacked and/or bonded through a "wafer-on-wafer" manufacturing process).

Further, and as shown in FIG. 5, the semiconductor package includes an interposer structure 506*c* between the one or more integrated circuit dies 504*c* and an array of interconnect structures 508*c* (e.g., an array of external interconnect structures). The interposer structure 506*c* may correspond to a multi-layer printed circuit board or a silicon interposer with one or more redistribution layers, among other examples. The array of interconnect structures 508*c* may include an array of integrated circuit die pads, wire bonds, pillars, solder balls, among other examples.

The interposer structure 506*c* may include a semiconductor structure 510. The semiconductor structure 510 may include the multi-layer structure 102*c* that is on and/or over the semiconductor layer structure 104*c*. Similar to the multi-layer structure 102*a* of FIG. 1, the multi-layer structure 102*c* may include the array of one or more dielectric layers 106*c*, the metal ring structure 108*c*, and the metal layer 110*c*. Further, and similar to the semiconductor layer structure 104*a* of FIG. 1, the semiconductor layer structure 104*c* may include the semiconductor layer 112*c* and the shallow trench isolation region 114*c* within the semiconductor layer 112*c*.

Similar to the semiconductor structure 100 of FIG. 1, the semiconductor structure 510 includes the interconnect structure 116*c* that is disposed along the approximately central axis 118*c* of the metal ring structure 108*c*.

Within the interposer structure 506*c*, and for a backside through silicon via type of interconnect structure that is shown in FIG. 5, the interconnect structure 116*c* may include a tapered shape. Further, and in some implementations, a width D1 of the interconnect structure 116*c* may be included in a range of approximately 10 microns to approximately 500 microns. However, other values and ranges for the width D1 are within the scope of the present disclosure.

The semiconductor structure 510 further includes the protective layer 122*c* between the interconnect structure 116*c* and the metal ring structure 108*c*. In contrast to the semiconductor structure 100 of FIG. 1, however, a dielectric sidewall structure (e.g., similar to the dielectric sidewall structure 120*a* of the semiconductor structure 100) is absent from the semiconductor structure 510. As such, the interconnect structure 116*c* is "self-aligned" to the metal ring structure 108*c*.

The number and arrangement of devices shown in FIG. 5 are provided as one or more examples. In practice, there may be additional devices, fewer devices, different devices, or differently arranged devices than those shown in FIG. 5.

Figure 6:
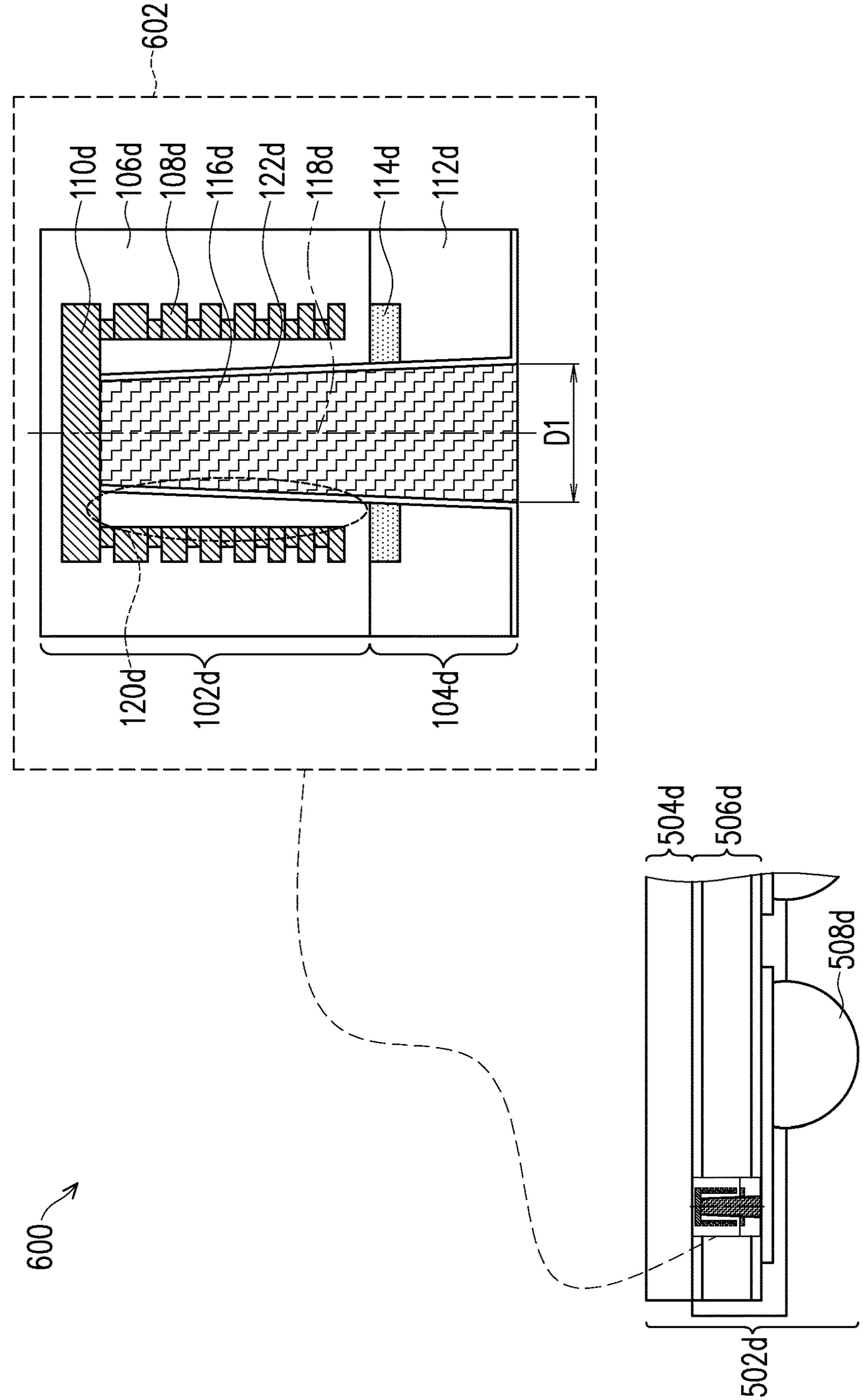

FIG. 6 is a diagram of an example implementation 600 of an example semiconductor package 502*d* described herein. The semiconductor package 502*d*, in whole or in part, may include features related to a ball grid array semiconductor package, a wafer-on-wafer semiconductor package, an image sensor semiconductor package, a stacked die semiconductor package, or a three-dimensional integrated circuit die package, among other examples.

As shown in FIG. 6, the semiconductor package 502*d* includes one or more integrated circuit dies 504*d*. The one or more integrated circuit dies 504*d* may correspond to one or more of a memory integrated circuit die, a logic integrated circuit die, or a computer image sensor integrated circuit die, among other examples. In some implementations, the one or more integrated circuit dies 504*d* are "stacked" integrated circuit dies (e.g., a three-dimensional structure including integrated circuit dies stacked and/or bonded through a "wafer-on-wafer" manufacturing process).

Further, and as shown in FIG. 6, the semiconductor package includes an interposer structure 506*d* between the one or more integrated circuit dies 504*d* and an array of interconnect structures 508*d* (e.g., an array of external interconnect structures). The interposer structure 506*d* may correspond to a multi-layer printed circuit board or a silicon interposer with one or more redistribution layers, among other examples. The array of interconnect structures 508*d* may include an array of integrated circuit die pads, wire bonds, pillars, solder balls, among other examples.

The interposer structure 506*d* may include a semiconductor structure 602. The semiconductor structure 602 may include the multi-layer structure 102*d* that is on and/or over the semiconductor layer structure 104*d*. Similar to the multi-layer structure 102*a* of FIG. 1, the multi-layer structure 102*d* may include the array of one or more dielectric layers 106*d*, the metal ring structure 108*d*, and the metal layer 110*d*. Further, and similar to the semiconductor layer structure 104*a* of FIG. 1, the semiconductor layer structure 104*d* may include the semiconductor layer 112*d* and the shallow trench isolation region 114*d* within the semiconductor layer 112*d*.

Similar to the semiconductor structure 100 of FIG. 1, the semiconductor structure 510 includes the interconnect structure 116*c* that is disposed along the approximately central axis 118*c* of the metal ring structure 108*c*.

Within the interposer structure 506*d*, and for a backside through silicon via type of interconnect structure that is shown in FIG. 6, the interconnect structure 116*d* may include a tapered shape. Further, and in some implementations, the width D1 of the interconnect structure 116*d* may be included in a range of approximately 10 microns to approximately 500 microns. However, other values and ranges for the width D1 are within the scope of the present disclosure.

The semiconductor structure 602 further includes the protective layer 122*d* between the interconnect structure 116*d* and the dielectric sidewall structure 120*d*. As such, the interconnect structure 116*d* is "non-self-aligned" to the metal ring structure 108*d*.

The number and arrangement of devices shown in FIG. 6 are provided as one or more examples. In practice, there may be additional devices, fewer devices, different devices, or differently arranged devices than those shown in FIG. 6.

FIGS. 7A-7D are diagrams of an example implementation 700 described herein. includes a series of semiconductor manufacturing operations that may be used in forming the semiconductor package 502*c* of FIG. 5 and/or the semiconductor package 502*d* of FIG. 6. The series of semiconductor manufacturing operations may be performed by one or more semiconductor processing tool sets, such as a deposition tool set (e.g., a vapor deposition tool and/or an electroplating tool), a photolithography tool set (a photoresist coat tool, an exposure tool, a developer tool, and or a photoresist removal tool), an etch tool set (e.g., a dry etch tool set or a wet etch tool), a planarization tool set (e.g., a chemical mechanical planarization (CMP) tool), and/or a bonding tool set (e.g., a eutectic bonding tool set) among other examples.

Figure 7A:
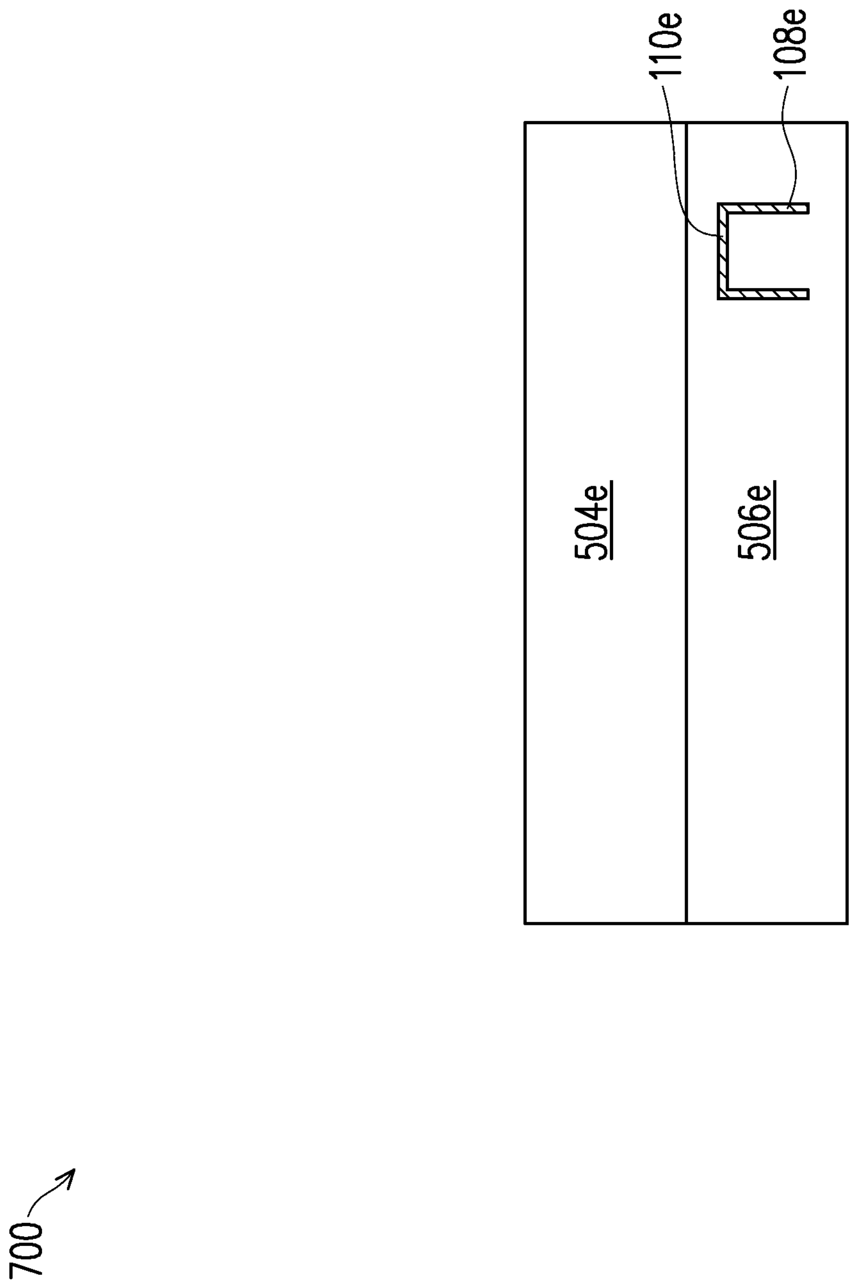
FIGS. 7A-7D are diagrams of an example implementation described herein.

As shown in FIG. 7A, the one or more integrated circuit dies 504*e* are on and/or over the interposer structure 506*e*. The interposer structure 506*e* may include the metal ring structure 108*e* and/or the metal layer 110*e*. In some implementations, the interposer structure is formed using techniques similar to those describe in connection with FIG. 2A and/or FIG. 4A.

In some implementations, and as shown in FIG. 7A, the one or more integrated circuit dies 504*c* and the interposer structure 506*e* are joined. As an example, the bonding tool may join the one or more integrated circuit dies 504*e* with the interposer structure 506*e* using a eutectic bonding process or another suitable bonding process.

Figure 7B:
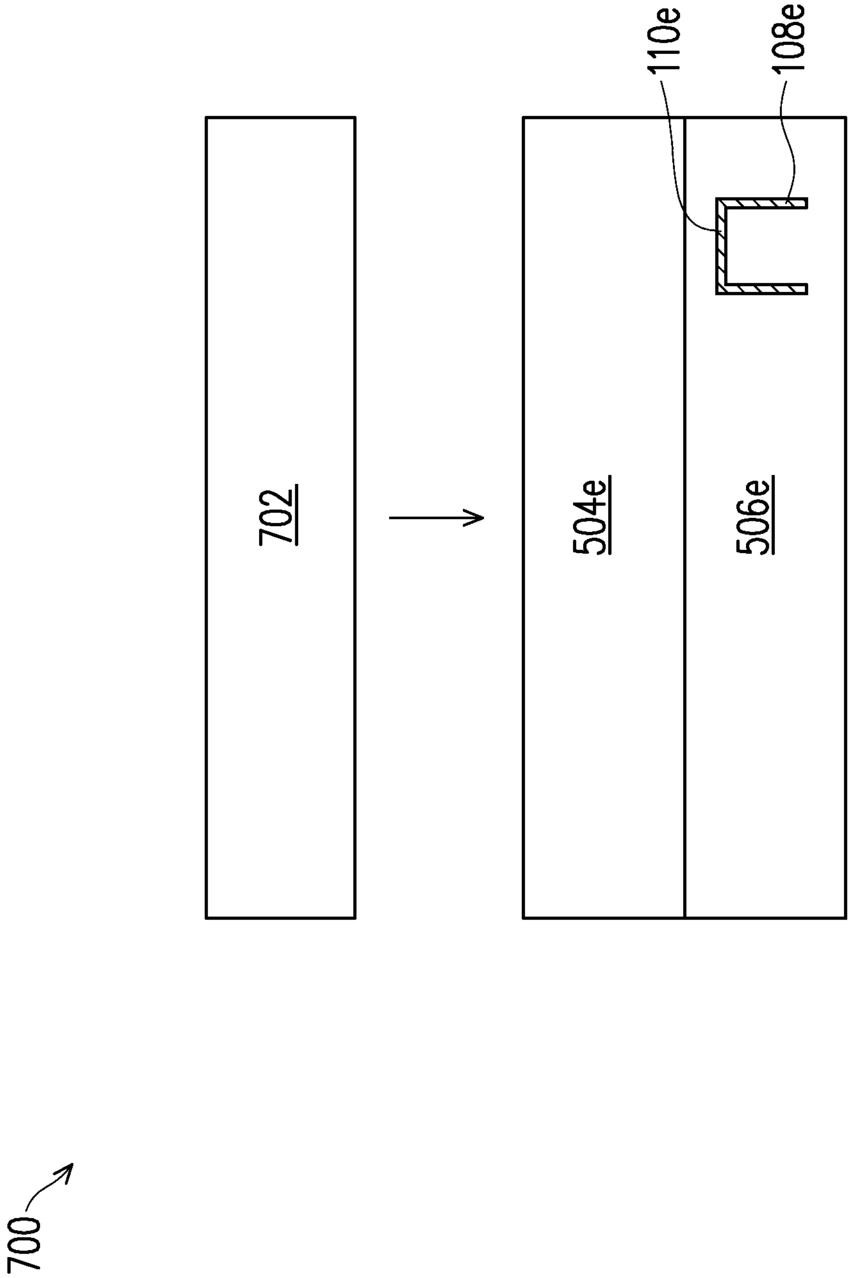

As shown in FIG. 7B, and as part of the implementation 700, a temporary carrier 702 (e.g., a silicon substrate or a glass substrate) is joined with the one or more integrated circuit dies 504*c*. As an example, the bonding tool may join the temporary carrier 702 and the one or more integrated circuit dies 504*e* using a eutectic bonding process or another suitable bonding process.

Figure 7C:
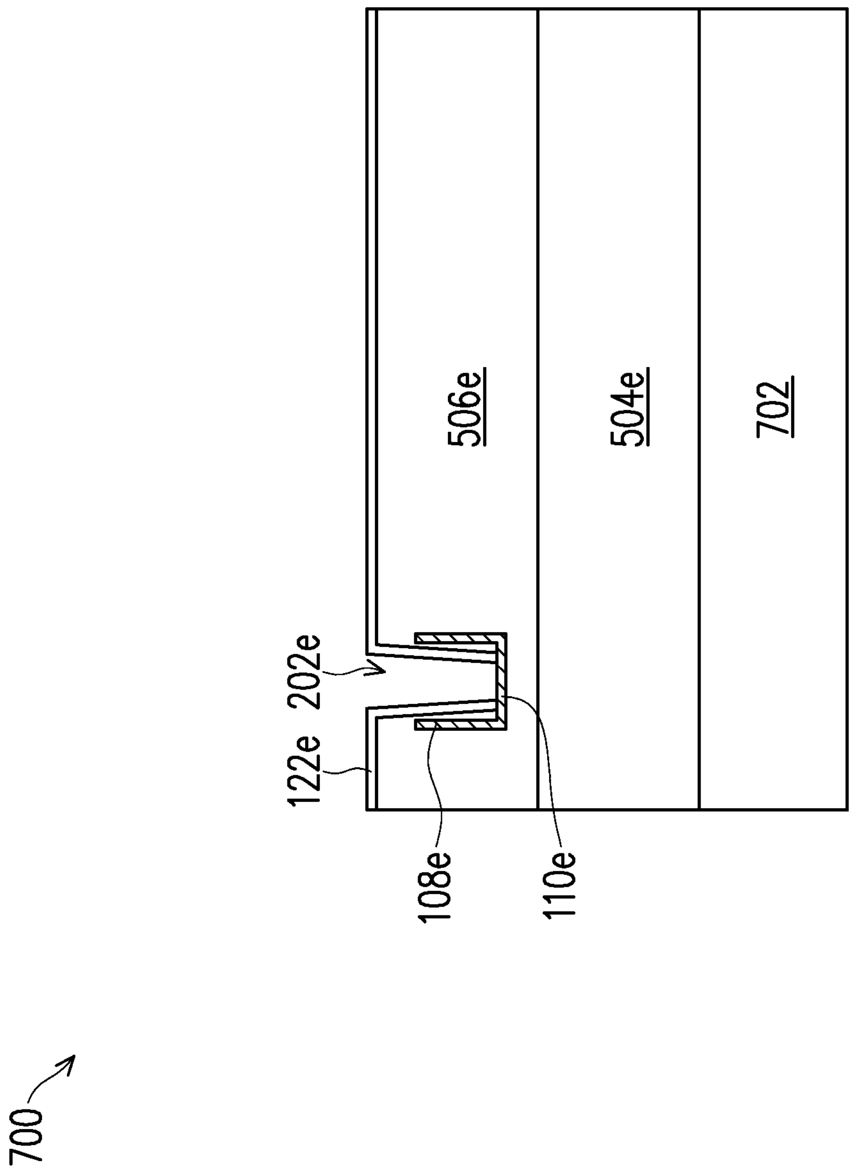

As shown in FIG. 7C, and as part of the implementation 700, the temporary carrier 702, the one or more integrated circuit dies 504*e*, and the interposer structure 506*e* are inverted. Using techniques similar to those described in connection with FIG. 2B and/or FIG. 4B, the photolithography tool set and the etch tool set may form the cavity 202*e* through a portion of the interposer structure 506*e* to expose the metal layer 110*e*. Furthermore, the deposition tool set may form the protective layer 122*e* in the cavity 202*e*, where the protective layer 122*e* is formed on and/or over sidewall structures within the cavity (remaining portions of dielectric layers that may be included in the interposer structure 506*e* and exposed during an etch process, among other examples).

Figure 7D:
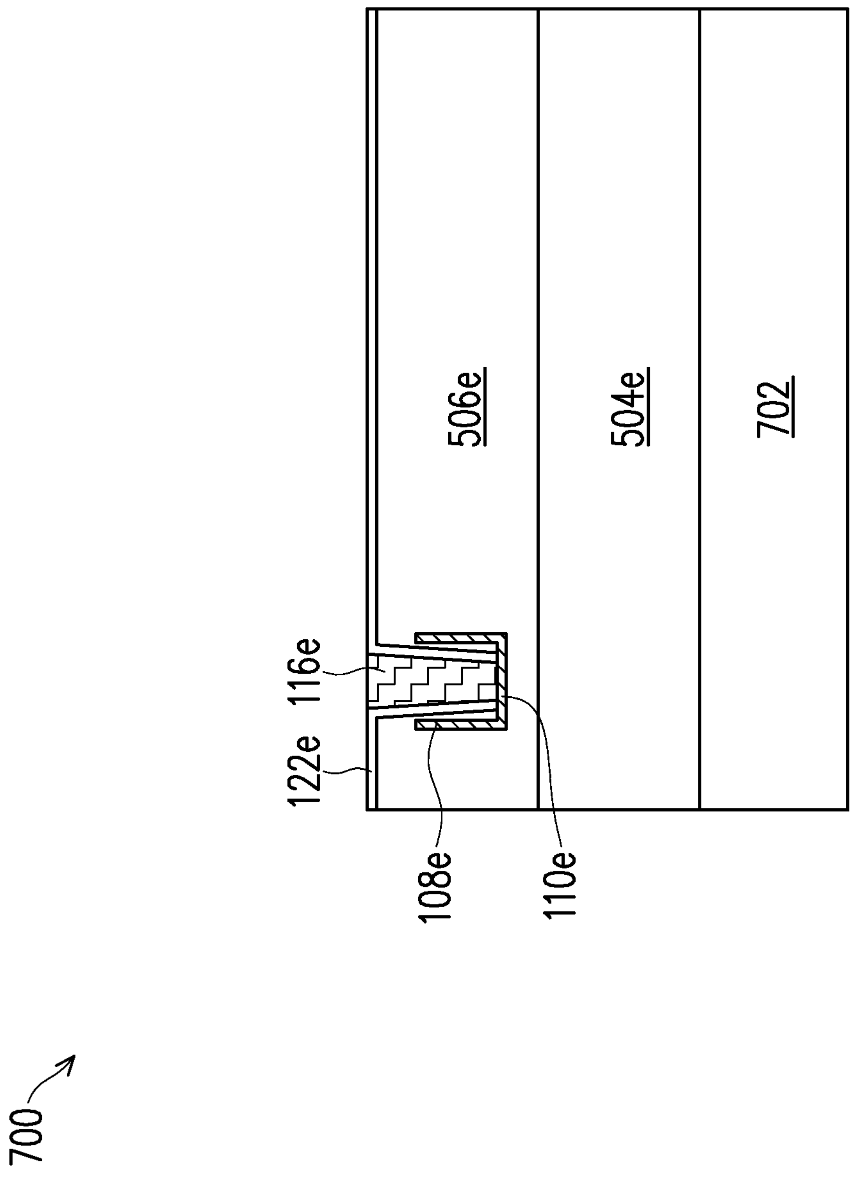

As shown in FIG. 7D, and as part of the implementation 700, the interconnect structure 116*e* is formed in on and/or over the protective layer 122*e* (e.g., within the cavity 202*c*). Using techniques similar to those described in connection with FIG. 2D and/or FIG. 4C, the deposition tool set and/or the planarization tool set may form the interconnect structure 116*e* on and/or over the protective layer 122*c*.

After the interconnect structure 116*e* is formed on and/or over the protective layer, the interposer structure 506*e* may be joined with an array of interconnect structures (e.g., the array of interconnect structures 508*c* of FIG. 5, the array of interconnect structures 508*d* of FIG. 6, or another array of interconnect structures). In some implementations, joining the interposer structure 506*e* with the array of interconnect structures includes populating the interposer structure 506*e* with the array of interconnect structures using a solder ball formation process or a bumping process. In some implementations, joining the interposer structure 506*e* with the array of interconnect structures includes joining the interposer to another structure including the array of interconnect structures (e.g., joining the interposer to a substrate including the array of interconnect structures using a wire bonding process or a surface mount process).

Although FIGS. 7A-7D show an example series of manufacturing operations, in some implementations, the series of manufacturing operations may include additional manufacturing operations, fewer manufacturing operations, different manufacturing operations, or differently arranged manufacturing operations than those depicted in FIGS. 7A-7D Additionally, or alternatively, one or more of the manufacturing operations may be performed by other semiconductor processing tools than those described in connection with FIGS. 7A-7D.

As described in connection with FIGS. 5-7D, a semiconductor package (e.g., the semiconductor package 502*c* and/or 502*d*) includes an integrated circuit device (e.g., the one or more integrated circuit dies 504*c* and/or 504*d*). The semiconductor package includes an array of interconnect structures (e.g., the array interconnect structures 508*c* and/or 508*d*). The semiconductor package includes an interposer structure (e.g., the interposer structure 506*c* and/or 506*d*) between the integrated circuit device and the array of interconnect structures. The interposer structure includes a multi-layer structure (e.g., the multi-layer structure 102*c* and/or 102*d*) that includes a metal ring structure (e.g., the metal ring structure 108*c* and/or 108*d*) and a metal layer (e.g., the metal layer 110*c* and/or 110*d*) connected with the metal ring structure above the metal ring structure. The interposer structure includes a semiconductor layer structure (e.g., the semiconductor layer structure 104*c* and/or 104*d*) below the multi-layer structure and an interconnect structure (e.g., the interconnect structure 116*c* and/or 116*c*) that passes through the semiconductor material layer, along an approximately central axis (e.g., the approximately central axis 118*c* and/or 118*d*) of the metal ring structure, and onto the metal layer. The interposer structure further includes a protective layer (e.g., the protective layer 122*d* and/or 120*e*) between the interconnect structure and the metal ring structure.

Figure 8:
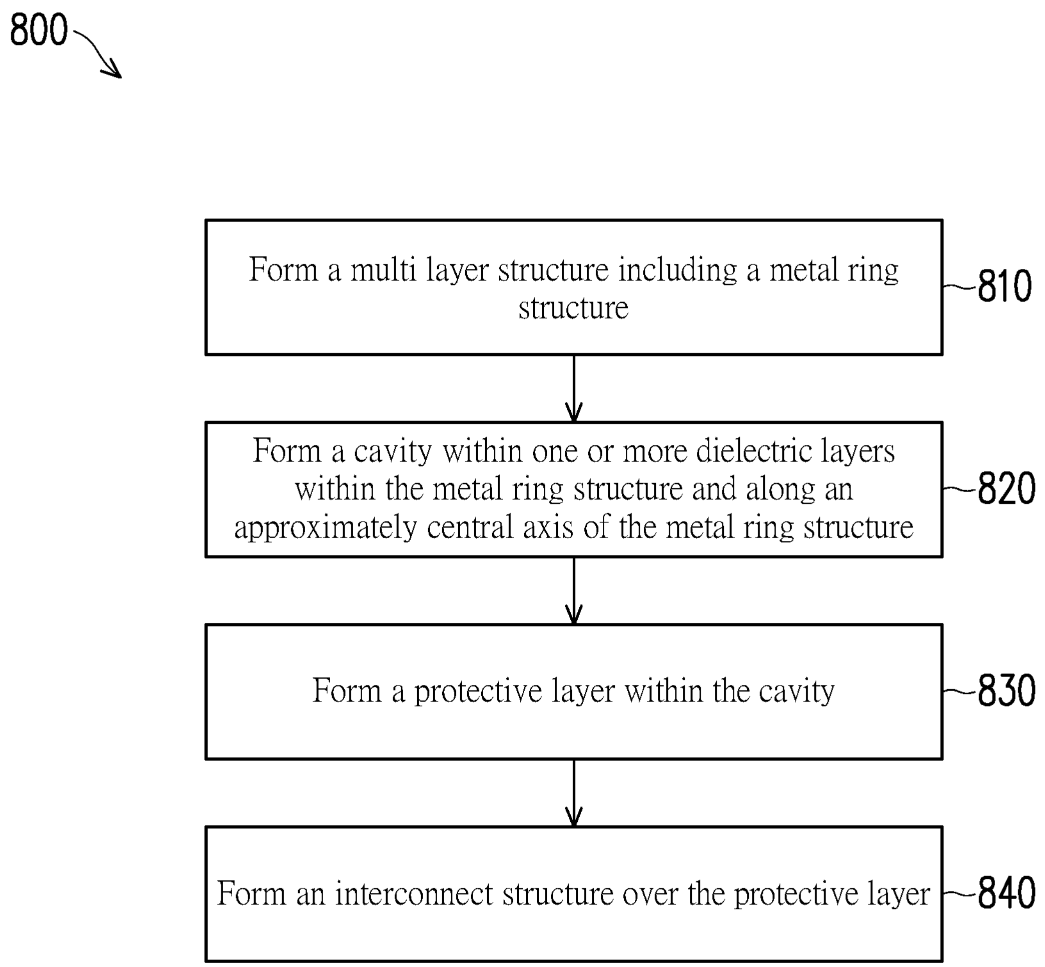
FIG. 8 is a flowchart of an example process associated with a semiconductor device and method of manufacturing the same.

FIG. 8 is a flowchart of an example process 800 associated with semiconductor device and method of manufacturing the same. In some implementations, one or more process blocks of FIG. 8 are performed by one or more semiconductor processing tools as described in connection with FIGS. 2A-2D, 4A-4C, 7A-7D, and elsewhere herein.

As shown in FIG. 8, process 800 may include forming a multi-layer structure including a metal ring structure (block 810). For example, one or more semiconductor processing tools may form a multi-layer structure (e.g., the multi-layer structure 102) including a metal ring structure (e.g., the metal ring structure 108), as described herein.

As further shown in FIG. 8, process 800 may include forming a cavity within one or more dielectric layers within the metal ring structure and along an approximately central axis of the metal ring structure (block 820). For example, one or more semiconductor processing tools may form a cavity (e.g., the cavity 202) within one or more dielectric layers (e.g., the one or more dielectric layers 106) within the metal ring structure and along an approximately central axis (e.g., the approximately central axis 118) of the metal ring structure, as described herein.

As further shown in FIG. 8, process 800 may include forming a protective layer within the cavity (block 830). For example, one or more semiconductor processing tools may form a protective layer (e.g., the protective layer 122) within the cavity, as described herein.

As further shown in FIG. 8, process 800 may include forming an interconnect structure over the protective layer (block 840). For example, one or more semiconductor processing tools may form an interconnect structure (e.g., the interconnect structure 116) over the protective layer, as described herein.

Process 800 may include additional implementations, such as any single implementation or any combination of implementations described below and/or in connection with one or more other processes described elsewhere herein.

In a first implementation, forming the cavity includes exposing portions of the one or more dielectric layers within the metal ring structure to form a dielectric sidewall structure (e.g., the dielectric sidewall structure 120) along interior surfaces of the metal ring structure.

In a second implementation, alone or in combination with the first implementation, forming the protective layer within the cavity includes forming the protective layer on surfaces of the dielectric sidewall structure.

In a third implementation, alone or in combination with one or more of the first and second implementations, forming the multi-layer structure includes forming a metal layer (e.g., the metal layer 110) below the metal ring structure that connects directly with the metal ring structure.

In a fourth implementation, alone or in combination with one or more of the first through third implementations, forming the cavity includes forming a first cavity (e.g., the cavity 202*a*) that passes through a semiconductor layer structure (e.g., the semiconductor layer structure 104*a*) above the multi-layer structure and further including forming a second cavity (e.g., the cavity 202*b*) through the protective layer to expose the metal layer.

In a fifth implementation, alone or in combination with one or more of the first through fourth implementations, forming the interconnect structure over the protective layer includes forming a portion of the interconnect structure in the second cavity that joins the interconnect structure and the metal layer.

In a sixth implementation, alone or in combination with one or more of the first through fifth implementations, forming the cavity includes forming a portion of the cavity (e.g., a portion of the cavity 202*c*) in a semiconductor layer structure (e.g., the semiconductor layer structure 104*b*) below the multi-layer structure (e.g., below the multi-layer structure 102*b*).

In a seventh implementation, alone or in combination with one or more of the first through sixth implementations, forming the protective layer within the cavity includes forming a portion of the protective layer on surfaces of the semiconductor layer structure (surfaces of the semiconductor layer structure 104*b*) exposed by a portion of the cavity (e.g., a portion of the cavity (202*c*).

In an eighth implementation, alone or in combination with one or more of the first through seventh implementations, forming the interconnect structure over the protective layer includes forming the interconnect structure to include a portion (e.g., a portion of the interconnect structure 116*b*) that penetrates into the semiconductor layer structure (e.g., the semiconductor layer structure 104*b*).

In a ninth implementation, alone or in combination with one or more of the first through eighth implementations, process 800 includes joining an interposer structure (e.g., the interposer structure 506) including the multi-layer structure with an array of interconnect structures (e.g., the array of interconnect structures 508) as part of forming a semiconductor package (e.g., the semiconductor package 502).

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

As described connection with FIGS. 2A-2D, 4A-4C, 7A-7D, and 8, a series of semiconductor manufacturing operations may include forming a multi-layer structure including a metal ring structure. The series of semiconductor manufacturing operations includes forming a cavity within one or more dielectric layers within the metal ring structure and along an approximately central axis of the metal ring structure. Furthermore, the series of semiconductor manufacturing operations includes forming a protective layer within the cavity. The series of semiconductor manufacturing operations includes forming an interconnect structure over the protective layer.

The series of semiconductor manufacturing operations may apply to formation of a semiconductor device (e.g., a semiconductor die or a semiconductor package). One or more one of the semiconductor manufacturing operations may be performed in a semiconductor wafer fabrication facility for fabricating semiconductor dies. Additionally, or alternatively, one or more of the semiconductor manufacturing operations may be performed in an outsourced assembly and test (OSAT) fabrication facility for assembling and testing semiconductor packages.

Some implementations herein provide a semiconductor device and methods for forming the semiconductor device. A multi-layer structure of the semiconductor device includes a metal ring structure and a dielectric sidewall structure along interior sidewalls of the metal ring structure. An interconnect structure (e.g., a through silicon via interconnect structure) is along a central interior axis of the metal ring structure. A protective layer is between the interconnect structure and the dielectric sidewall structure.

During a deposition operation that fills a cavity with a conductive material to form the interconnect structure, the protective layer may protect the dielectric sidewall structure from damage (e.g., delamination effects and/or pitting). Furthermore, the protective layer may inhibit diffusion of the conductive material into the dielectric sidewall structure and/or the metal ring structure.

In this way, a quality and/or a reliability of the semiconductor device including the interconnect structure and formed using the protective layer is improved relative to another semiconductor device including the interconnect structure but not formed using the protective layer. By improving the quality and/or reliability of the semiconductor device, an amount of resources to manufacture and support a volume of the semiconductor device including the interconnect structure (e.g., raw materials, labor, semiconductor manufacturing tools, and/or computing resources) is reduced.

As described in greater detail above, some implementations described herein provide a device. The device includes a multi-layer structure including a metal ring structure and a dielectric sidewall structure along interior surfaces of the metal ring structure. The device includes an interconnect structure that is disposed along an approximately central axis of the metal ring structure. The device includes a protective layer between the interconnect structure and the dielectric sidewall structure.

As described in greater detail above, some implementations described herein provide a semiconductor package. The semiconductor package includes an integrated circuit device. The semiconductor package includes an array of interconnect structures. The semiconductor package includes an interposer structure between the integrated circuit device the array of interconnect structures. The interposer structure includes a multi-layer structure that includes a metal ring structure and a metal layer connected with the metal ring structure above the metal ring structure. The interposer structure includes a semiconductor layer structure below the multi-layer structure and an interconnect structure that passes through the semiconductor layer structure, along an approximately central axis of the metal ring structure, and onto the metal layer. The interposer structure further includes a protective layer between the interconnect structure and the metal ring structure.

As described in greater detail above, some implementations described herein provide a method. The method includes forming a multi-layer structure including a metal ring structure. The method includes forming a cavity within one or more dielectric layers within the metal ring structure and along an approximately central axis of the metal ring structure. The method includes forming a protective layer within the cavity. The method includes forming an interconnect structure over the protective layer.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
- forming a multi-layer structure including a metal ring structure and a metal layer;
- forming a first cavity within one or more dielectric layers and within the metal ring structure,
  - wherein the first cavity is formed along an approximately central axis of the metal ring structure;
- forming a protective layer within the first cavity,
  - wherein the protective layer is formed on sidewalls of the first cavity and a bottom surface of the first cavity, and
  - wherein the protective layer comprises an oxide material; and
- forming a second cavity through the protective layer and through a portion of the one or more dielectric layers to expose the metal layer; and
- forming an interconnect structure within the first cavity and the second cavity,
  - wherein the interconnect structure is formed to be in contact with the metal layer.

2. The method of claim 1, wherein forming the first cavity comprises:
- exposing portions of the one or more dielectric layers within the metal ring structure to form a dielectric sidewall structure along interior surfaces of the metal ring structure.

3. The method of claim 2, wherein forming the protective layer within the first cavity comprises:
- forming the protective layer on surfaces of the dielectric sidewall structure.

4. The method of claim 1, wherein forming the multi-layer structure comprises:
- forming the metal layer below the metal ring structure that connects directly with the metal ring structure.

5. The method of claim 1, wherein the first cavity is formed by passing through a semiconductor layer structure above the multi-layer structure.

6. The method of claim 5, wherein forming the protective layer within the first cavity comprises:
- forming a portion of the protective layer on surfaces of the semiconductor layer structure exposed by the first cavity.

7. The method of claim 6, wherein forming the interconnect structure comprises:
- forming the interconnect structure to include a portion that penetrates into the semiconductor layer structure.

8. The method of claim 1, further comprising:
- joining an interposer structure including the multi-layer structure with an array of interconnect structures as part of forming a semiconductor package.

9. A method, comprising:
- forming a multi-layer structure including a metal ring structure and a metal layer;
- etching a dielectric layer within the metal ring structure to form a first cavity, wherein the first cavity is formed along an approximately central axis of the metal ring structure;

depositing a protective layer on portions of the dielectric layer within the first cavity, wherein the protective layer comprises an oxide material;

etching through a portion of the protective layer and a portion of the dielectric layer on a bottom surface of the first cavity to form a second cavity, wherein the metal layer is exposed by forming the second cavity; and depositing, within the first cavity and the second cavity, an interconnect structure to be in contact with the metal layer.

10. The method of claim 9, wherein the portions of the dielectric layer within the first cavity form a dielectric sidewall structure.

11. The method of claim 9, wherein a dielectric sidewall structure along interior surfaces of the metal ring structure is formed by etching the dielectric layer within the metal ring structure.

12. The method of claim 9, wherein forming the multi-layer structure comprises:

forming the metal layer below the metal ring structure and to connect directly with the metal ring structure.

13. The method of claim 9, wherein the first cavity is formed by passing through a semiconductor layer structure above the multi-layer structure.

14. The method of claim 13, wherein a portion of the protective layer is deposited on surfaces of the semiconductor layer structure exposed by the first cavity.

15. The method of claim 13, wherein depositing the interconnect structure comprises:

depositing the interconnect structure to include a portion that penetrates into the semiconductor layer structure.

16. A method, comprising:

forming a semiconductor layer structure and a multi-layer structure, wherein the multi-layer structure includes a metal ring structure and a metal layer;

etching through the semiconductor layer structure and a portion of a dielectric layer within the metal ring structure to form a first cavity, wherein the first cavity is formed along an approximately central axis of the metal ring structure;

depositing a protective layer on portions of the semiconductor layer structure and portions of the dielectric layer within the first cavity, wherein the protective layer comprises an oxide material;

etching through a portion of the protective layer and a portion of the dielectric layer on a bottom surface of the first cavity to form a second cavity, wherein the metal layer is exposed by forming the second cavity; and depositing, within the first cavity and the second cavity, an interconnect structure to be in contact with the metal layer.

17. The method of claim 16, wherein a dielectric sidewall structure is formed along interior surfaces of the metal ring structure by etching through the semiconductor layer structure and the portion of the dielectric layer within the metal ring structure.

18. The method of claim 17, wherein depositing the protective layer on the portions of the dielectric layer within the first cavity comprises:

depositing the protective layer on the dielectric sidewall structure.

19. The method of claim 16, wherein the semiconductor layer structure comprises a shallow trench isolation region.

20. The method of claim 16, wherein etching through the semiconductor layer structure and the portion of the dielectric layer within the metal ring structure to form the first cavity comprises:

performing one or more of a plasma etch operation or a wet chemical etch operation.

* * * * *